(12) United States Patent
Machida

(10) Patent No.: US 12,392,561 B2
(45) Date of Patent: Aug. 19, 2025

(54) LOOP-TYPE HEAT PIPE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 206 days.

(21) Appl. No.: 18/479,337

(22) Filed: Oct. 2, 2023

(65) Prior Publication Data

US 2024/0110752 A1    Apr. 4, 2024

(30) Foreign Application Priority Data

Oct. 3, 2022 (JP) ................................. 2022-159594

(51) Int. Cl.
*F28D 15/00* (2006.01)
*F28D 15/02* (2006.01)
*F28D 15/04* (2006.01)

(52) U.S. Cl.
CPC ....... *F28D 15/0266* (2013.01); *F28D 15/043* (2013.01)

(58) Field of Classification Search
CPC ............................ F28D 15/043; F28D 15/0266
See application file for complete search history.

(56) References Cited

U.S. PATENT DOCUMENTS

| 2018/0058767 A1 | 3/2018 | Machida et al. |
| 2019/0013257 A1 | 1/2019 | Kurashima |
| 2019/0242652 A1 | 8/2019 | Machida |
| 2020/0025458 A1 | 1/2020 | Takahashi et al. |
| 2020/0404802 A1 | 12/2020 | Takahashi et al. |
| 2022/0107136 A1 | 4/2022 | Takahashi et al. |
| 2023/0358481 A1 | 11/2023 | Takahashi et al. |

FOREIGN PATENT DOCUMENTS

| EP | 3 575 727 A1 | 4/2019 |
| JP | 2018-036012 A | 3/2018 |
| JP | 2019-135434 A | 8/2019 |
| JP | 2019-196896 A | 11/2019 |

OTHER PUBLICATIONS

Extended European Search Report issued on Feb. 7, 2024, Application No. EP 23 20 0921, 8 pages.

*Primary Examiner* — Travis Ruby
(74) *Attorney, Agent, or Firm* — Rankin, Hill & Clark LLP

(57) ABSTRACT

An evaporator includes a first metal layer having a first inner surface and a first outer surface, a second metal layer having a second inner surface and a second outer surface, and a porous body provided between the first outer surface and the second outer surface. The porous body includes a first bottomed hole provided in the first inner surface, a second bottomed hole provided in the second inner surface, a first fine pore, wherein the first bottomed hole and the second bottomed hole partially communicate with each other through the first fine pore, a first groove portion provided in the first inner surface and configured to communicate with the first bottomed hole, and a second groove portion provided in the second inner surface and configured to communicate with the second bottomed hole. The first outer surface and the second outer surface serve as an outer surface of the evaporator.

8 Claims, 16 Drawing Sheets

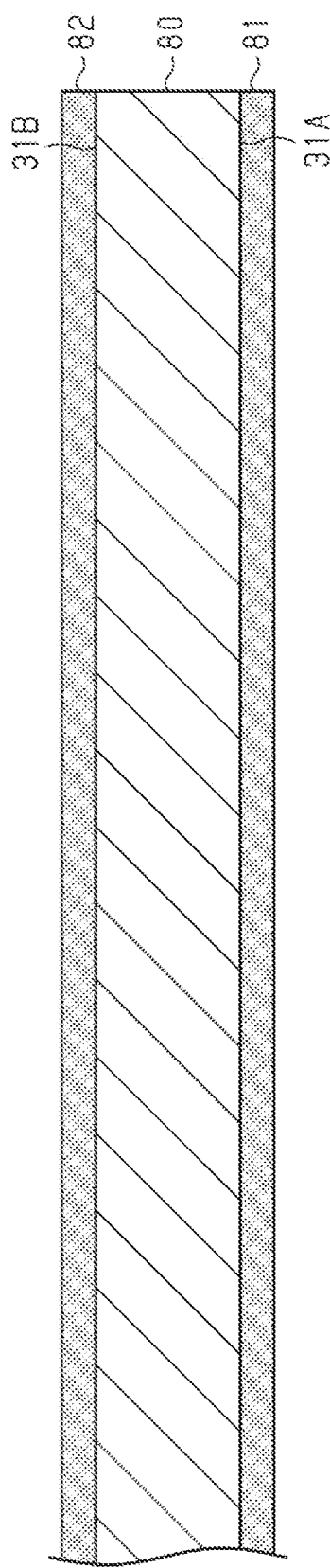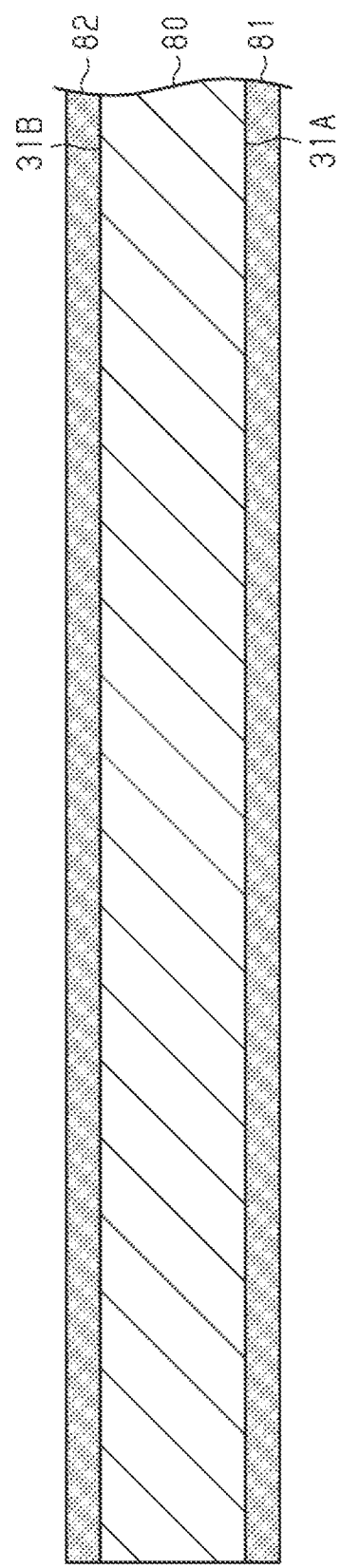

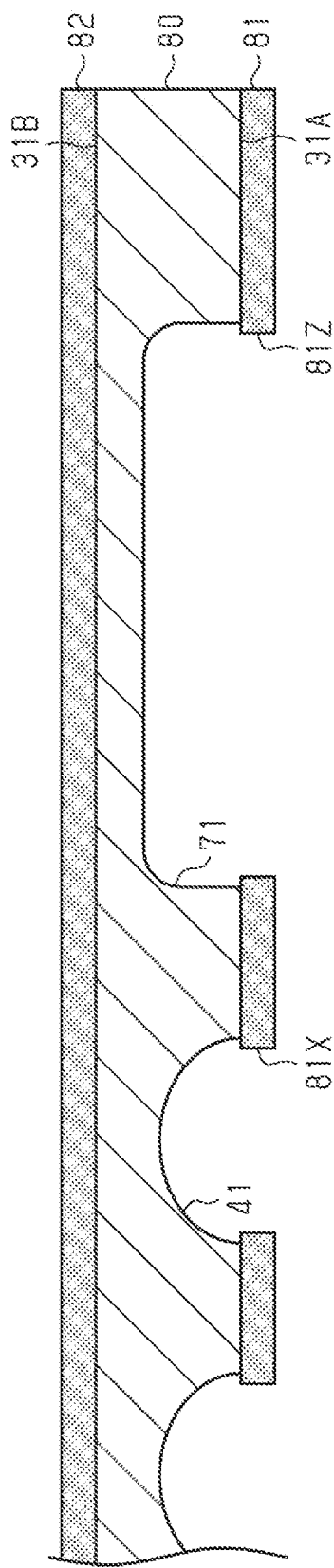
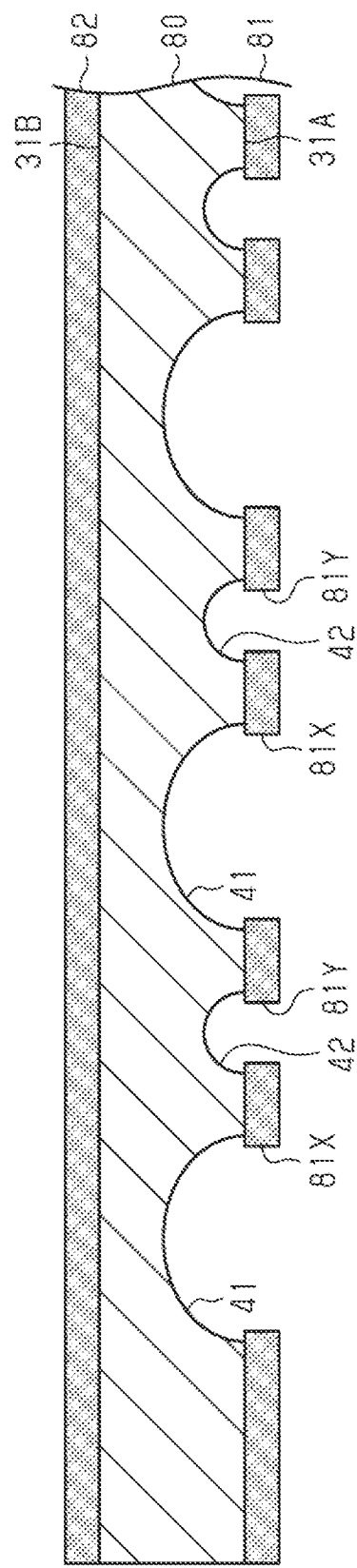
FIG. 13A
FIG. 13B

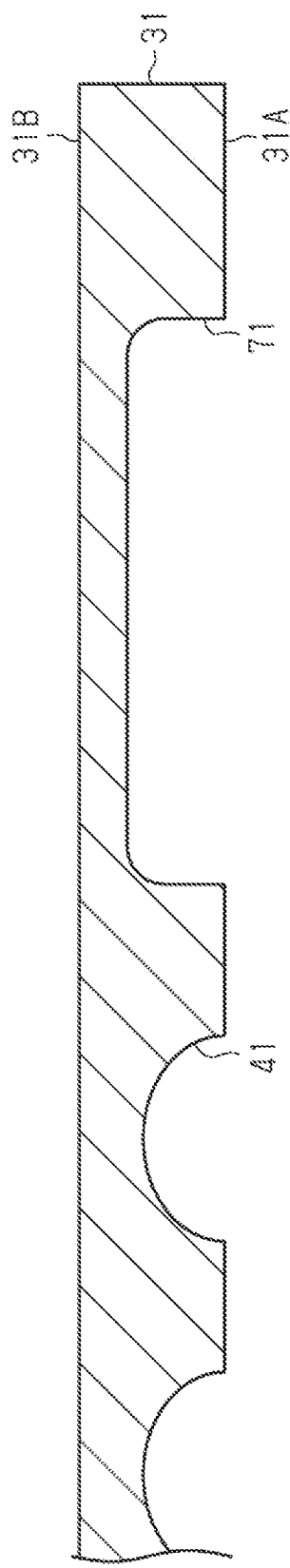
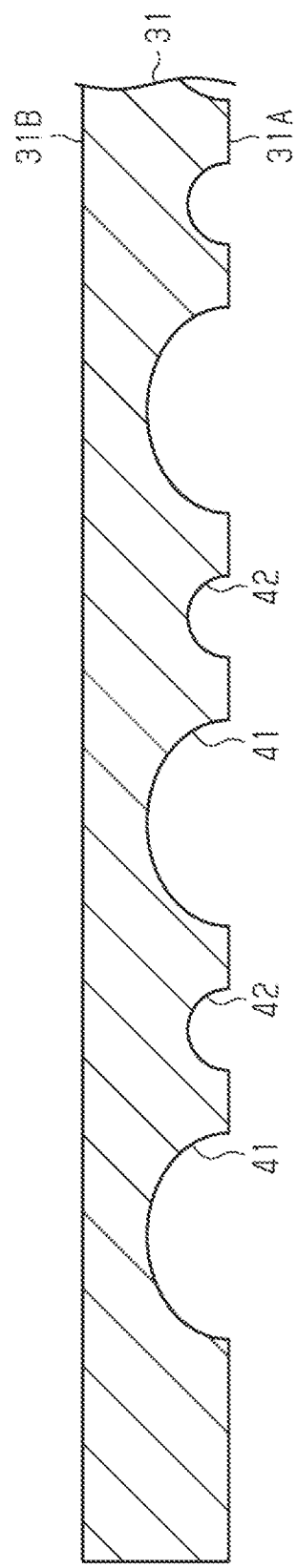

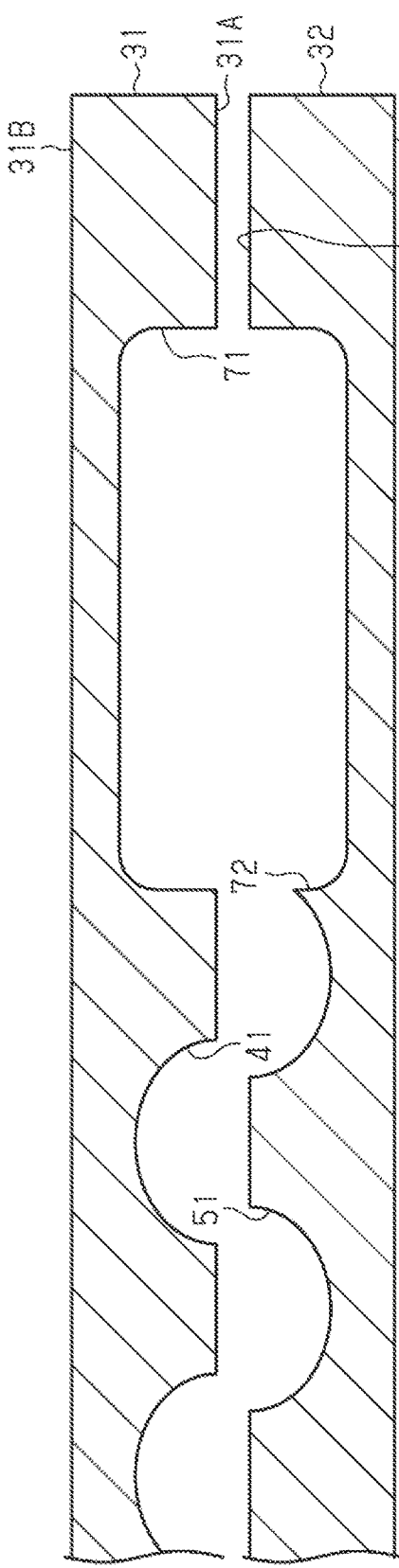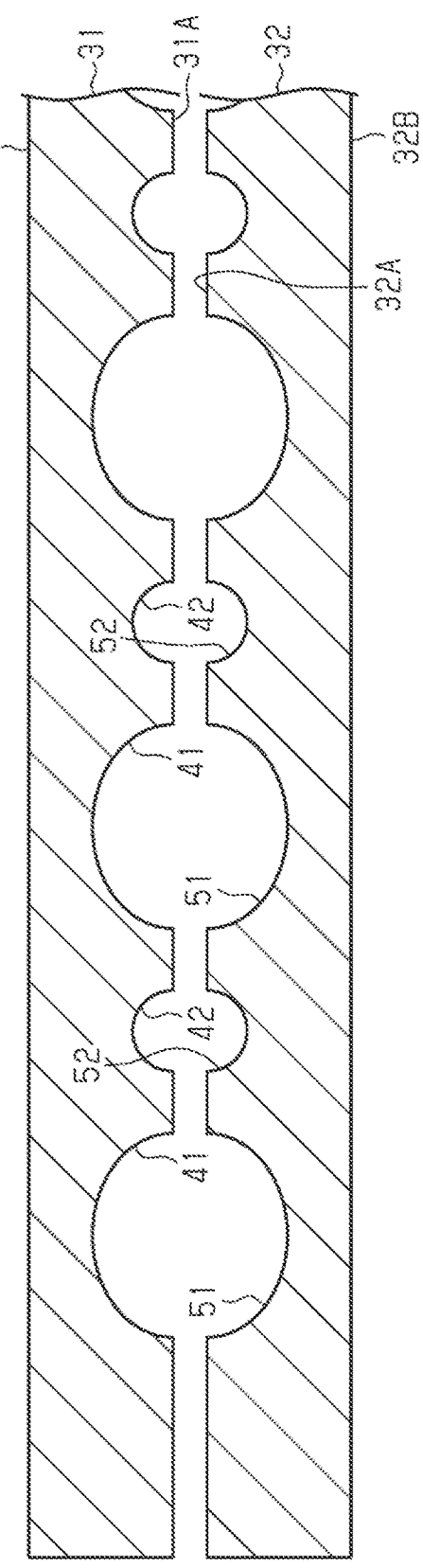

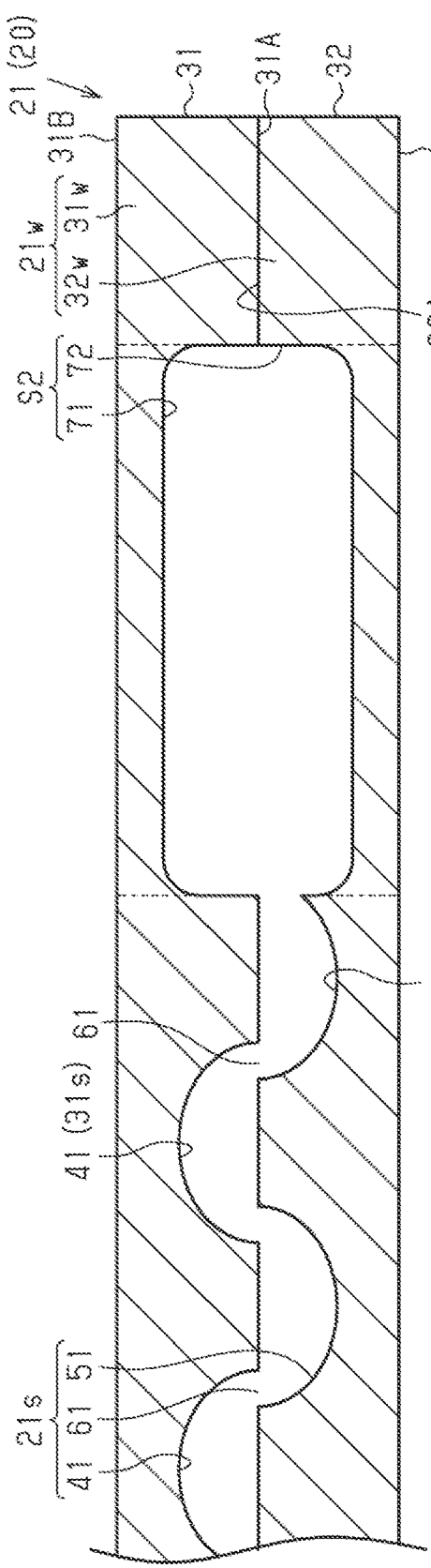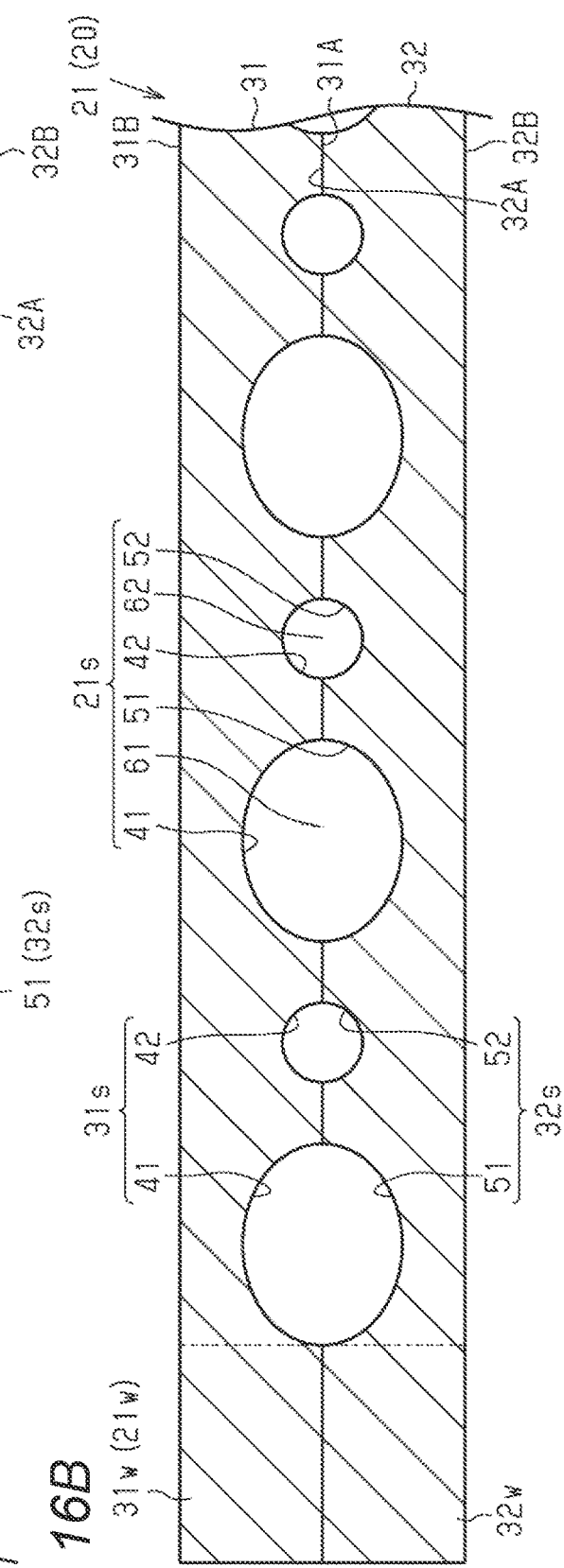

LOOP-TYPE HEAT PIPE

CROSS-REFERENCE TO RELATED APPLICATIONS

This application claims priority from Japanese Patent Application No. 2022-159594 filed on Oct. 3, 2022, the contents of which are incorporated herein by reference.

TECHNICAL FIELD

The present invention relates to a loop-type heat pipe.

BACKGROUND ART

In the related art, a heat pipe configured to transport heat by using a phase change of a working fluid is suggested as a device configured to cool a heat-generating component of a semiconductor device (for example, a CPU or the like) mounted on an electronic device (for example, refer to JP2018-036012A and JP2019-135434A).

As an example of the heat pipe, known is a loop-type heat pipe including an evaporator configured to vaporize a working fluid by heat of a heat-generating component and a condenser configured to cool and condense the vaporized working fluid, in which the evaporator and the condenser are connected by a liquid pipe and a vapor pipe that form a loop-shaped flow channel. In the loop-type heat pipe, the working fluid flows in one direction in the loop-shaped flow channel.

SUMMARY OF INVENTION

For the loop-type heat pipe described above, further thinning is desired.

Certain embodiment provides a loop-type heat pipe comprising:
an evaporator configured to vaporize a working fluid;
a condenser configured to condense the working fluid;
a liquid pipe configured to connect the evaporator and the condenser to each other;
a vapor pipe configured to connect the evaporator and the condenser to each other; and
a loop-shaped flow channel provided in each of the evaporator, the condenser, the liquid pipe, and the vapor pipe, and through which the working fluid flows,
wherein at least one of the evaporator, the condenser, the liquid pipe, and the vapor pipe comprises:
a first metal layer having a first inner surface and a first outer surface,
a second metal layer having a second inner surface bonded to the first inner surface and a second outer surface, and
a porous body provided between the first outer surface and the second outer surface, and
wherein the porous body comprises:
a first bottomed hole provided in the first inner surface,
a second bottomed hole provided in the second inner surface,
a first fine pore, wherein the first bottomed hole and the second bottomed hole partially communicate with each other through the first fine pore,
a first groove portion provided in the first inner surface and configured to communicate with the first bottomed hole, and
a second groove portion provided in the second inner surface and configured to communicate with the second bottomed hole,
wherein the first outer surface and the second outer surface serve as an outer surface of the at least one of the evaporator, the condenser, the liquid pipe, and the vapor pipe.

According to one aspect of the present invention, it is possible to obtain an effect capable of thinning.

BRIEF DESCRIPTION OF DRAWINGS

FIGS. 11A and 11B are schematic cross-sectional views showing a method of manufacturing a loop-type heat pipe of one embodiment.

FIGS. 13A and 13B are schematic cross-sectional views showing the method of manufacturing a loop-type heat pipe of one embodiment.

FIGS. 14A and 14B are schematic cross-sectional views showing the method of manufacturing a loop-type heat pipe of one embodiment.

FIGS. 15A and 15B are schematic cross-sectional views showing the method of manufacturing a loop-type heat pipe of one embodiment.

FIGS. 16A and 16B are schematic cross-sectional views showing the method of manufacturing a loop-type heat pipe of one embodiment.

DESCRIPTION OF EMBODIMENTS

Hereinafter, one embodiment will be described with reference to the accompanying drawings.

Note that, for convenience, in the accompanying drawings, a characteristic part is enlarged so as to easily understand the feature, and the dimension ratios of the respective constitutional elements may be different in the respective drawings. Further, in the cross-sectional views, hatching of some members is shown in a satin form and hatching of some members is omitted, so as to easily understand a sectional structure of each member. In the respective drawings, XYZ axes orthogonal to one another are shown. In descriptions below, for convenience, a direction extending along the X-axis is referred to as 'X-axis direction', a direction extending along the Y-axis is referred to as 'Y-axis direction', and a direction extending along the Z-axis is referred to as 'Z-axis direction'. Note that, in the present specification, 'in a plan view' means seeing a target object from a vertical direction (Z-axis direction, here) in FIG. 3 and the like, and 'a planar shape' means a shape of the target object seen from the vertical direction in FIG. 3 and the like.

(Overall Configuration of Loop-type Heat Pipe 20)

Figure 1:
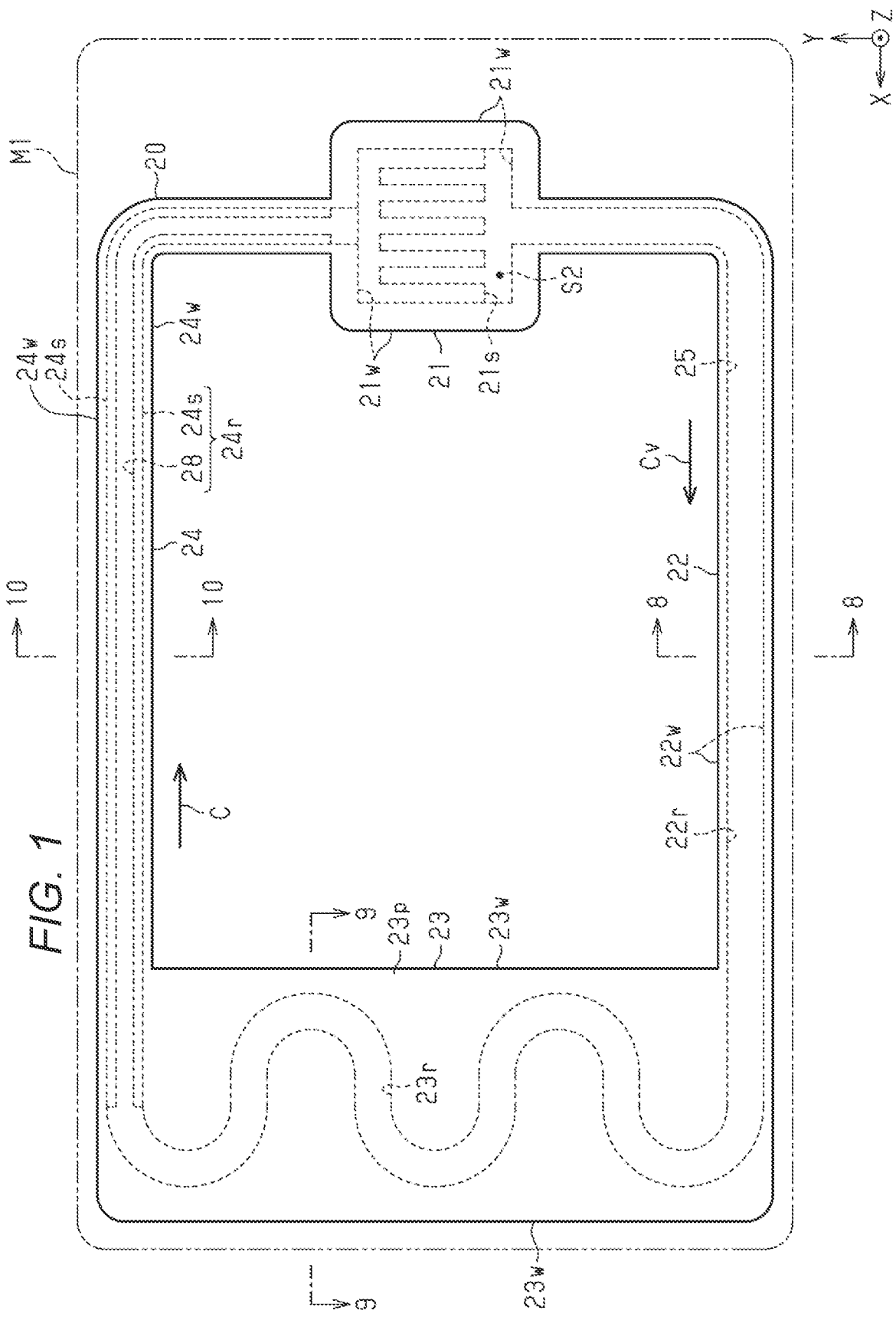
FIG. 1 is a schematic plan view showing a loop-type heat pipe of one embodiment.

A loop-type heat pipe 20 shown in FIG. 1 is accommodated in a mobile electronic device M1 such as a smart phone and a tablet terminal, for example. The loop-type heat pipe 20 includes an evaporator 21, a vapor pipe 22, a condenser 23, and a liquid pipe 24.

The evaporator 21 and the condenser 23 are connected by the vapor pipe 22 and the liquid pipe 24. The evaporator 21 has a function of vaporizing a working fluid C to generate vapor Cv. The vapor Cv generated in the evaporator 21 is sent to the condenser 23 via the vapor pipe 22. The condenser 23 has a function of condensing the vapor Cv of the working fluid C. The condensed working fluid C is sent to the evaporator 21 via the liquid pipe 24. The vapor pipe 22 and the liquid pipe 24 form a loop-shaped flow channel 25 through which the working fluid C or the vapor Cv is caused to flow.

The vapor pipe 22 is formed into, for example, a long tubular body. The liquid pipe 24 is formed into, for example, a long tubular body. In the present embodiment, the vapor pipe 22 and the liquid pipe 24 are the same in dimension (i.e., length) in a length direction, for example. Note that the length of the vapor pipe 22 and the length of the liquid pipe 24 may be different from each other. For example, the length of the vapor pipe 22 may be shorter than the length of the liquid pipe 24. Here, in the present specification, the 'length direction' of the evaporator 21, the vapor pipe 22, the condenser 23 and the liquid pipe 24 is a direction that coincides with a direction (refer to an arrow in the drawing) in which the working fluid C or vapor Cv in each member flows. In addition, in the present specification, the 'same' includes not only a case in which comparison targets are exactly the same but also a case in which there is a slight difference between the comparison targets due to influences of dimensional tolerances and the like.

(Configuration of Evaporator 21)

The evaporator 21 is fixed in close contact with a heat-generating component (not shown). The working fluid C in the evaporator 21 is vaporized by heat generated in the heat-generating component, and accordingly, vapor Cv is generated. Note that a thermal interface material (TIM) may also be interposed between the evaporator 21 and the heat-generating component. The TIM reduces contact thermal resistance between the heat-generating component and the evaporator 21 to cause heat to be conducted smoothly from the heat-generating component to the evaporator 21.

(Configuration of Vapor Pipe 22)

The vapor pipe 22 has, for example, a pair of pipe walls 22w provided on opposite sides in a width direction orthogonal to the length direction of the vapor pipe 22, in a plan view, and a flow channel 22r provided between the pair of pipe walls 22w. The flow channel 22r communicates with an internal space of the evaporator 21. The flow channel 22r is a part of the loop-shaped flow channel 25. The vapor Cv generated in the evaporator 21 is guided to the condenser 23 via the vapor pipe 22.

(Configuration of Condenser 23)

The condenser 23 has, for example, a heat dissipation plate 23p whose area has been increased for heat dissipation, and a flow channel 23r provided inside the heat dissipation plate 23p. The flow channel 23r communicates with the flow channel 22r. The flow channel 23r is a part of the loop-shaped flow channel 25. The condenser 23 has pipe walls 23w provided on opposite sides in the width direction orthogonal to the length direction of the flow path 23r, in a plan view. The vapor Cv guided via the vapor pipe 22 is condensed in the condenser 33.

(Configuration of Liquid Pipe 24)

The liquid pipe 24 has, for example, a pair of pipe walls 24w provided on opposite sides in the width direction orthogonal to the length direction of the liquid pipe 24, in a plan view, and a flow channel 24r provided between the pair of pipe walls 24w. The flow channel 24r communicates with the flow channel 23r of the condenser 23, and communicates with the internal space of the evaporator 21. The flow channel 24r is a part of the loop-shaped flow channel 25.

The liquid pipe 24 has, for example, a pair of porous bodies 24s and a flow channel 28 provided between the pair of porous bodies 24s. Each of the porous bodies 24s extends from the condenser 23 to the vicinity of the evaporator 21 along the length direction of the liquid pipe 24, for example. Each of the porous bodies 24s guides the working fluid C condensed in the condenser 23 to the evaporator 21 by capillary force generated in the porous body 24s.

In the loop-type heat pipe 20, the heat generated in the heat-generating component is moved to the condenser 23 and radiated in the condenser 23. Thereby, the heat-generating component is cooled, and the temperature rise of the heat-generating component is suppressed.

Here, as the working fluid C, a fluid having a high vapor pressure and a high latent heat of vaporization is preferably used. By using such a working fluid C, it is possible to effectively cool the heat-generating component by the latent heat of vaporization. As the working fluid C, ammonia, water, freon, alcohol, acetone and the like can be used, for example.

(Specific Structure of Evaporator 21)

Figure 2:
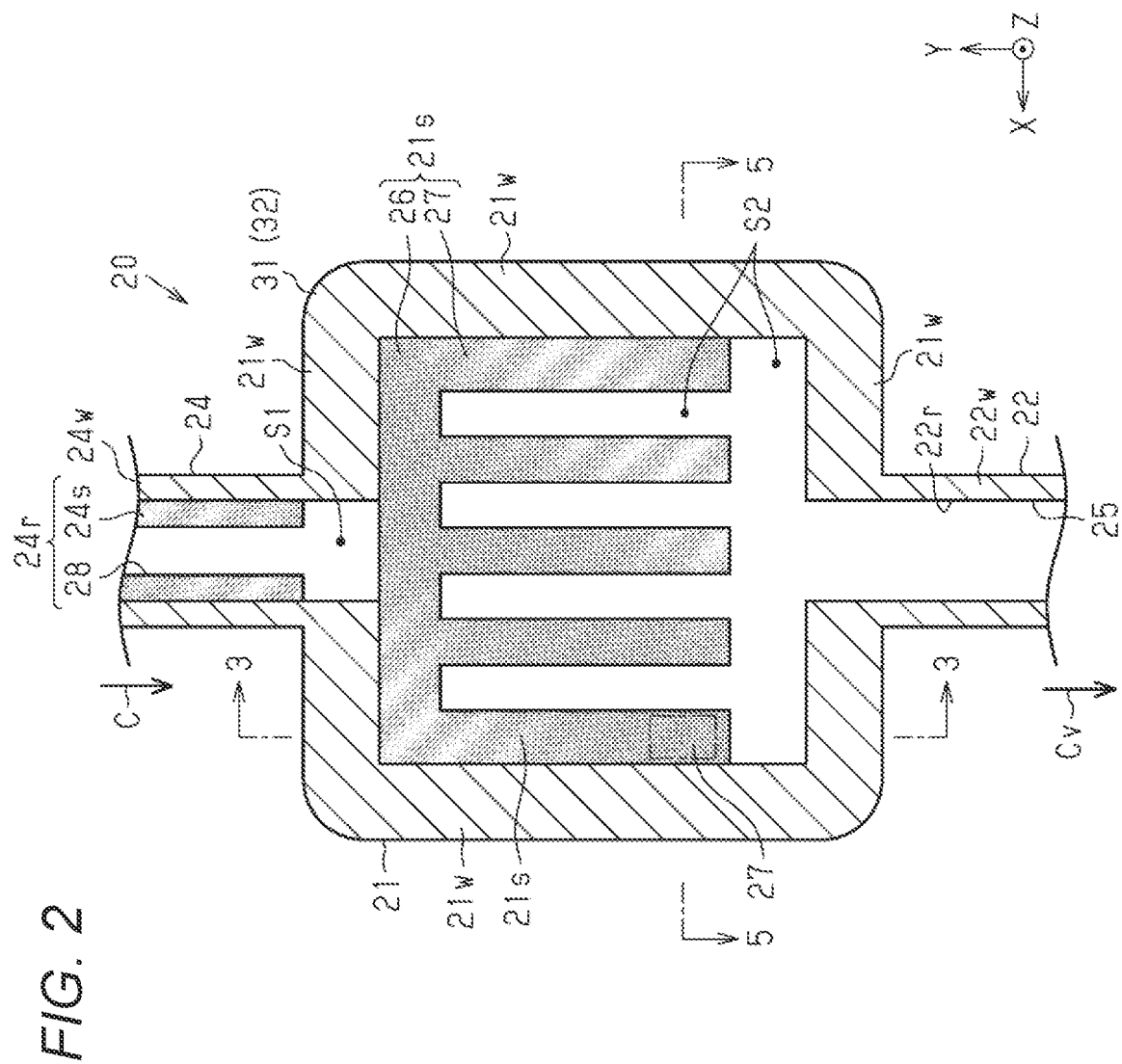
FIG. 2 is a schematic plan view showing a part of the loop-type heat pipe of one embodiment.

As shown in FIG. 2, the evaporator 21 has, for example, pipe walls 21w and porous bodies 21s. The pipe walls 21w are provided at opposite ends in the width direction (here, X-axis direction) of the evaporator 21, for example. The pipe walls 21w are provided at opposite ends in the length direction (here, Y-axis direction) of the evaporator 21, for example.

The porous body 21s has a connecting portion 26 and a plurality of projections 27. The connecting portion 26 is provided, for example, at a part, which is closest to the liquid pipe 24, of the internal space of the evaporator 21, in a plan view. The connecting portion 26 is formed to extend in the width direction (here, X-axis direction) of the evaporator 21, for example. A surface of the connecting portion 26 on the liquid pipe 24 side has a part in contact with the pipe walls 21w and a remaining part in contact with a space S1, for example. A surface of the connecting part 26 on the vapor pipe 22 side has a part connecting to the projections 27 and a remaining part in contact with a space S2. Each of the projections 27 protrudes from the connecting portion 26 toward the vapor pipe 22 in a plan view, for example. Each of the projections 27 is formed to extend along the length direction (here, Y-axis direction) of the evaporator 21, for example. The plurality of projections 27 are provided spaced at intervals in the width direction of the evaporator 21 in a plan view, for example. The space S2 is provided between two projections 27 adjacent to each other in the X-axis direction. An end portion of each projection 27 on the vapor pipe 22 side is provided spaced from the pipe walls 21w of the evaporator 21. In other words, the space S2 is provided between the end portion of each projection 27 on the vapor pipe 22 side and the pipe wall 21w. In the plurality of projections 27, the end portions on the vapor pipe 22 side are not connected to each other.

In this way, the porous body 21s of the present embodiment is formed in a comb-tooth shape having the connecting portion 26 and the plurality of projections 27 in a plan view. The number of comb-teeth of the porous body 21s can be changed as appropriate. Note that when a contact area between the projection 27 and the space S2 is increased, the working fluid C is easily vaporized, and the pressure loss can be reduced.

In the internal space of the evaporator 21, the space S2 is formed in a region where the porous body 21s is not provided. The space S2 communicates with the flow channel 22r of the vapor pipe 22.

When the working fluid C is guided to the evaporator 21 from the liquid pipe 24 side, the working fluid C penetrates into the porous body 21s. The working fluid C penetrating into the porous body 21s in the evaporator 21 is vaporized by heat generated in the heat-generating component fixed to the evaporator 21 to produce vapor Cv. The vapor Cv passes through the space S2 in the evaporator 21 and flows to the vapor pipe 22.

Figure 3:
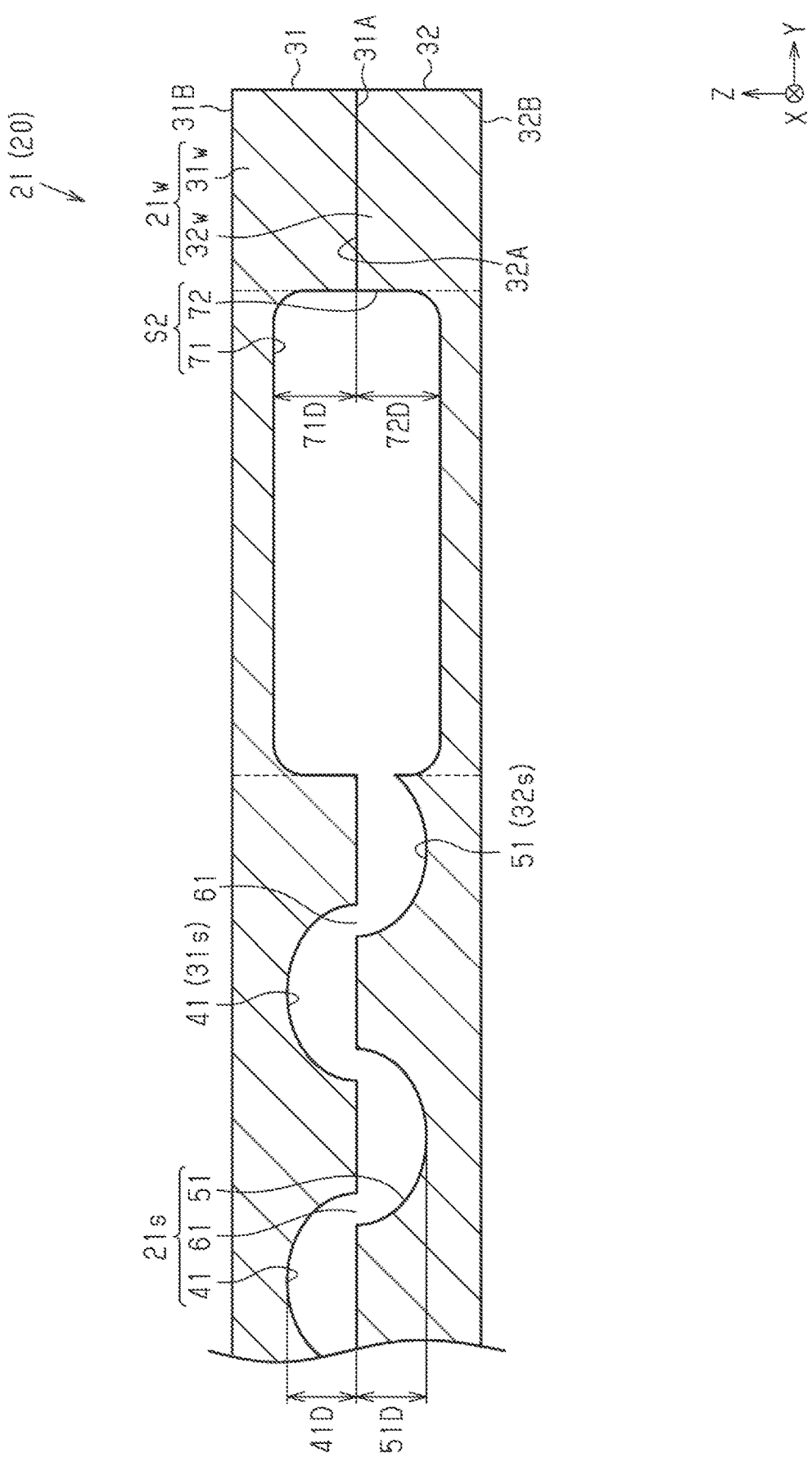
FIG. 3 is a schematic cross-sectional view (a cross-sectional view taken along a line 3-3 in FIGS. 2 and 4) showing an evaporator of one embodiment.

As shown in FIG. 3, the evaporator 21 has a structure in which two layers of a first metal layer 31 and a second metal layer 32 are stacked. In other words, the evaporator 21 is constituted by only the first metal layer 31 and the second metal layer 32 serving as a pair of outer metal layers.

The first metal layer 31 and the second metal layer 32 are, for example, copper (Cu) layers having excellent thermal conductivity. The first metal layer 31 and the second metal layer 32 are directly bonded to each other by solid-phase bonding such as diffusion bonding, pressure welding, friction pressure welding or ultrasonic bonding. Note that, in FIG. 3 and subsequent drawings, the first metal layer 31 and the second metal layer 32 are distinguished from each other by a solid line for easy understanding. For example, when the first metal layer 31 and the second metal layer 32 are integrated by diffusion bonding, an interface between the first metal layer 31 and the second metal layer 32 may disappear, so a boundary therebetween may be unclear. As used herein, the solid-phase bonding is a method in which bonding target objects are not melted into each other but softened by heat in a solid-phase (solid) state, and then plastically deformed by further heat to be bonded to each other. Note that each of the first metal layer 31 and the second metal layer 32 is not limited to the copper layer, but may also be formed of a stainless steel layer, an aluminum layer, a magnesium alloy layer or the like. Further, for the first metal layer 31 and the second metal layer 32, different materials may be used. A thickness of each of the first metal layer 31 and the second metal layer 32 can be set, for example, within a range of about 50 μm to 200 μm. Note that the thickness of the first metal layer 31 and the thickness of the second metal layer 32 may be different from each other, for example.

(Configuration of First Metal Layer 31 and Second Metal Layer 32)

The first metal layer 31 is stacked on an upper surface of the second metal layer 32. The first metal layer 31 has a first inner surface 31A (here, lower surface) that is bonded to the second metal layer 32, and a first outer surface 31B (here, upper surface) that is provided on an opposite side to the first inner surface 31A in a thickness direction (here, Z-axis direction) of the first metal layer 31. The first outer surface 31B becomes an outer surface of the evaporator 21. The first metal layer 31 has, for example, a first wall portion 31w, a first porous body 31s, and a first concave portion 71.

The second metal layer 32 has a second inner surface 32A (here, upper surface) that is bonded to the first inner surface 31A, and a second outer surface 32B (here, lower surface) that is provided on an opposite side to the second inner surface 32A in the thickness direction (here, Z-axis direction) of the second metal layer 32. The second outer surface 32B becomes an outer surface of the evaporator 21. The second metal layer 32 has, for example, a second wall portion 32w, a second porous body 32s, and a second concave portion 72. The second wall portion 32w is provided at a position overlapping the first wall portion 31w in a plan view. The second porous body 32s is provided at a position partially overlapping the first porous body 31s in a plan view. The second concave portion 72 is provided at a position overlapping the first concave portion 71 in a plan view.

The pipe wall 21w is constituted by the first wall portion 31w of the first metal layer 31 and the second wall portion 32w of the second metal layer 32. In the pipe wall 21w, the first inner surface 31A of the first wall portion 31w and the second inner surface 32A of the second wall portion 32w are bonded to each other. No hole or groove is formed in each of the first wall portion 31w and the second wall portion 32w, for example. The porous body 21s is constituted by the first porous body 31s of the first metal layer 31 and the second porous body 32s of the second metal layer 32. The porous body 21s is provided between the first outer surface 31B and the second outer surface 32B. The space S2 provided inside the evaporator 21 is constituted by the first concave portion 71 of the first metal layer 31 and the second concave portion 72 of the second metal layer 32.

(Specific Configuration of Porous Body 21s)

Figure 4:
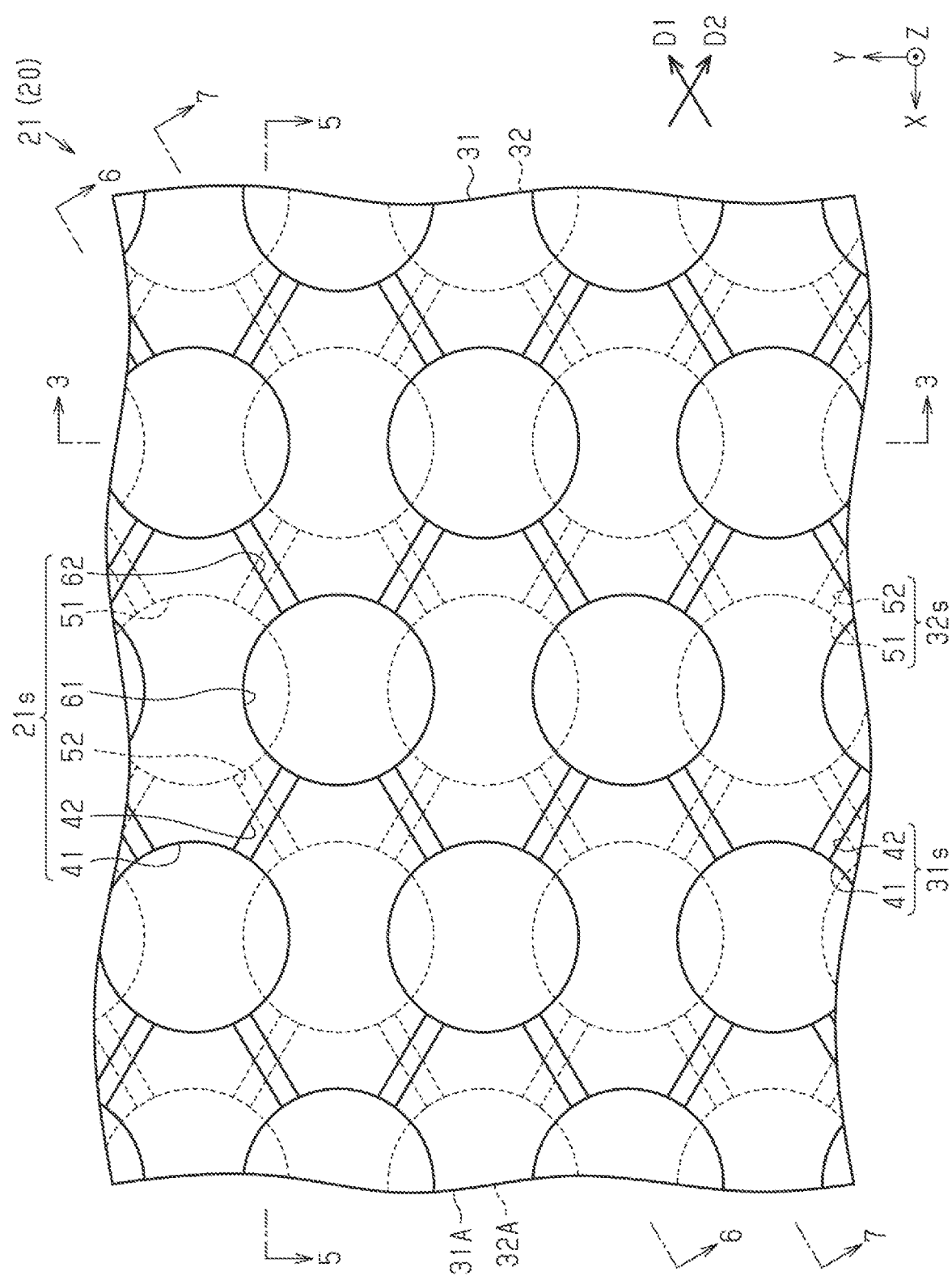
FIG. 4 is an enlarged plan view showing a part of a porous body of the evaporator of one embodiment.
Figure 5:
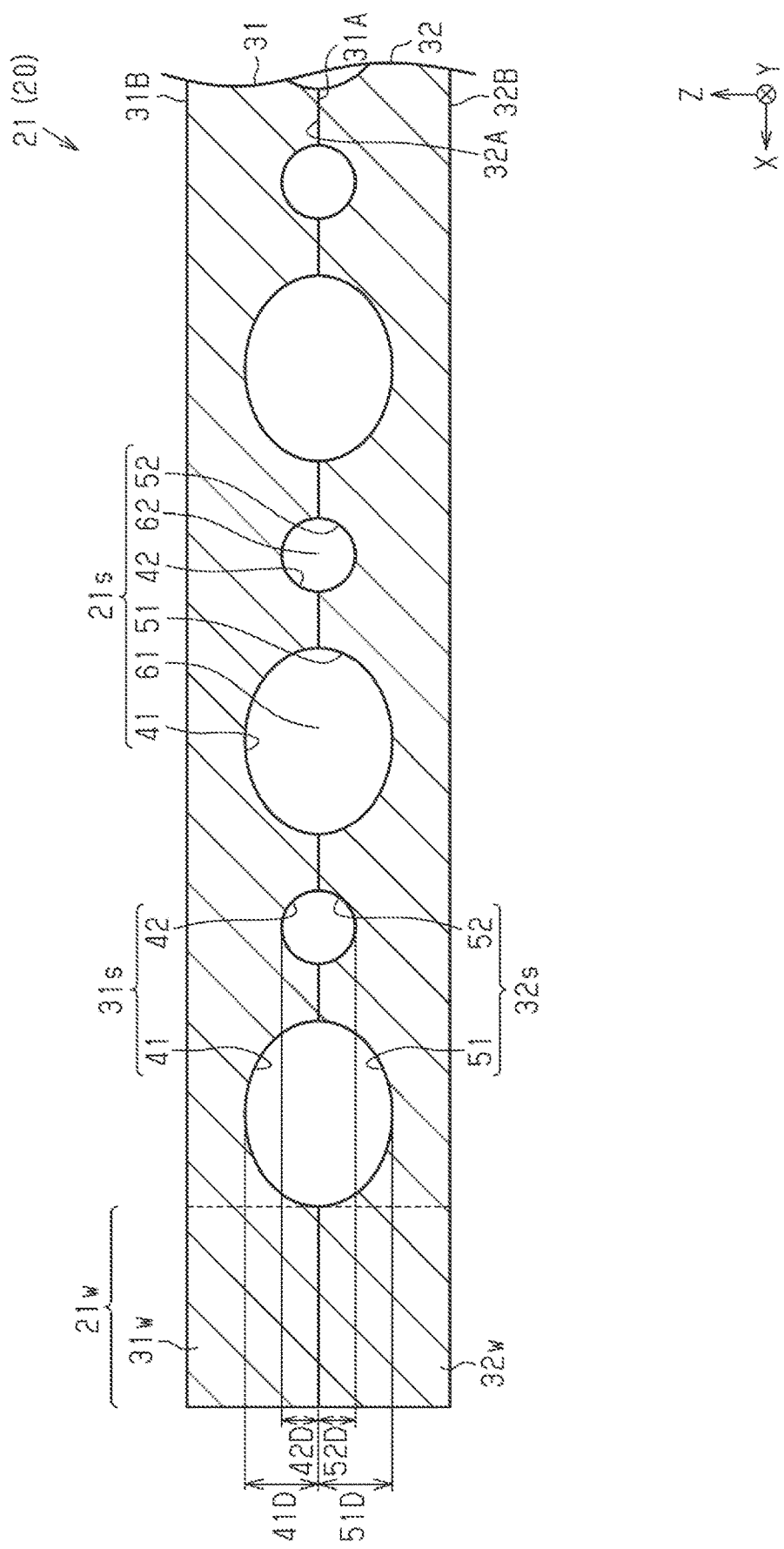
FIG. 5 is a schematic cross-sectional view (a cross-sectional view taken along a line 5-5 in FIGS. 2 and 4) showing the evaporator of one embodiment.

As shown in FIGS. 4 and 5, the first porous body 31s has a plurality of first bottomed holes 41, and first groove portions 42 each communicating two or more bottomed holes 41. The second porous body 32s has a plurality of second bottomed holes 51, and second groove portions 52 each communicating two or more bottomed holes 51. The porous body 21s has first fine pores 61 formed as the first bottomed holes 41 and the second bottomed holes 51 partially communicate with each other, and second fine pores 62 formed as the first groove portions 42 and the second groove portions partially communicate with each other. Note that FIG. 4 is an enlarged plan view of a portion of the porous body 21s, specifically, a portion surrounded by the dashed-dotted line in FIG. 2. In addition, in FIG. 4, for convenience, the first bottomed holes 41 and the first groove portions 42 provided in the first metal layer 31 are shown by solid lines, and the second bottomed holes 51 and the second groove portions 51 provided in the second metal layer 32 are shown by broken lines.

As shown in FIG. 5, the first bottomed hole 41 is formed recessed from the first inner surface 31A of the first metal layer 31 to a central portion in the thickness direction of the first metal layer 31. A depth 41D of the first bottomed hole 41 can be set, for example, within a range of about 20 μm to 100 μm. The first groove portion 42 is formed recessed from the first inner surface 31A of the first metal layer 31 toward the central portion in the thickness direction of the first metal layer 31. A depth 42D of the first groove portion 42 is smaller than the depth 41D of the first bottomed hole 41. The depth 42D of the first groove portion 42 is preferably within a range of 0.5 times or greater and less than 0.8 times the depth 41D of the first bottomed hole 41, for example. Here, when the depth 42D of the first groove portion 42 is set to a depth of less than 0.5 times the depth 41D of the first bottomed hole 41, the first groove portion 42 is crushed upon bonding of the first metal layer 31 and the second metal layer 32, so a possibility that the first groove portion 42 will not function as a moving path for the working fluid C increases. In addition, when the depth 42D of the first groove portion 42 is set to a depth 0.8 times or greater than the depth 41D of the first bottomed hole 41, the capillary force generated in the first groove portion 42 is reduced. The depth 42D of the first groove portion 42 can be set, for example, within a range of about 10 μm to 70 μm.

The second bottomed hole 51 is formed recessed from the second inner surface 32A of the second metal layer 32 to a central portion in the thickness direction of the second metal layer 32. A depth 51D of the second bottomed hole 51 can be set, for example, within a range of about 20 μm to 100 μm. The second groove portion 52 is formed recessed from the second inner surface 32A of the second metal layer 32 toward the central portion in the thickness direction of the second metal layer 32. The depth 52D of the second groove portion 52 is smaller than the depth 51D of the second bottomed hole 51. The depth 52D of the second groove portion 52 is preferably within a range of 0.5 to 0.8 times the depth 51D of the second bottomed hole 51, for example. Here, when the depth 52D of the second groove portion 52 is set to a depth less than 0.5 times the depth 51D of the second bottomed hole 51, the second groove portion 52 is crushed upon bonding of the first metal layer 31 and the second metal layer 32, so a possibility that the second groove portion 52 will not function as a moving path for the working fluid C increases. In addition, when the depth 52D of the second groove portion 52 is set to a depth of 0.8 times or greater than the depth 51D of the second bottomed hole 51, the capillary force generated in the second groove portion 52 is reduced. The depth 52D of the second groove portion 52 can be set, for example, within a range of about 10 μm to 70 μm.

An inner surface of the first bottomed hole 41 is formed, for example, in a shape of a continuous arc from an opening side, i.e., the first inner surface 31A side of the first metal layer 31 to a bottom surface side. An inner surface of the second bottomed hole 51 is formed, for example, in a shape of a continuous arc from an opening side, i.e., the second inner surface 32A side of the second metal layer 32 to a bottom surface side. The inner surfaces of the first bottomed hole 41 and the second bottomed hole 51 are each formed as a curved surface curved in an arc shape in a cross sectional view. The bottom surfaces of the first bottomed hole 41 and the second bottomed hole 51 are each formed as a curved surface curved in an arc shape in a cross sectional view. The bottom surface of the first bottomed hole 41 is formed to be continuous with the inner surface of the first bottomed hole 41, for example. A radius of curvature of the bottom surface of the first bottomed hole 41 may be the same as a radius of curvature of the inner surface of the first bottomed hole 41 or may be different from a radius of curvature of the inner surface of the first bottomed hole 41. The bottom surface of the second bottomed hole 51 is formed to be continuous with the inner surface of the second bottomed hole 51, for example. A radius of curvature of the bottom surface of the second bottomed hole 51 may be the same as a radius of curvature of the inner surface of the second bottomed hole 51 or may be different from a radius of curvature of the inner surface of the second bottomed hole 51.

The inner surface of each of the first bottomed hole 41 and the second bottomed hole 51 of the present embodiment is formed in a concave shape with a semi-circular or semi-elliptical cross section. As used herein, in the present specification, the 'semi-circular shape' includes not only a semi-circle obtained by bisecting a true circle, but also, for example, one having an arc longer or shorter than the semi-circle. In addition, in the present specification, the 'semi-elliptical shape' includes not only a semi-ellipse obtained by bisecting an ellipse, but also, for example, one having an arc longer or shorter than the semi-ellipse. Note that the inner surface of each of the first bottomed hole 41 and the second bottomed hole 51 may be formed to have a tapered shape that widens from the bottom surface side toward the opening side. Further, the bottom surface of the first bottomed hole 41 may be formed to be a plane parallel to the first inner surface 31A of the first metal layer 31, and the inner surface of the first bottomed hole 41 may be formed to extend perpendicularly to the bottom surface. The bottom surface of the second bottomed hole 51 may be formed to be a plane parallel to the second inner surface 32A of the second metal layer 32, and the inner surface of the second bottomed hole 51 may be formed to extend perpendicularly to the bottom surface.

The planar shape of each of the first bottomed hole 41 and the second bottomed hole 51 may be formed to have any shape and any size. The planar shape of each of the first bottomed hole 41 and the second bottomed hole 51 may be formed into, for example, a circular shape, an elliptical shape or a polygonal shape. The planar shape of the first bottomed hole 41 and the planar shape of the second bottomed hole 51 may be the same or different from each other. As shown in FIG. 4, the planar shape of each of the first bottomed hole 41 and the second bottomed hole 51 of the present embodiment is a circular shape. A diameter of each of the first bottomed hole 41 and the second bottomed hole 51 may be set, for example, within a range of about 100 μm to 400 μm.

The plurality of first bottomed holes 41 are aligned in a zigzag pattern, for example, in a plan view. For example, the plurality of first bottomed holes 41 are provided at predetermined intervals along the X-axis direction, and are provided at predetermined intervals along the Y-axis direction. However, the first bottomed holes 41 adjacent to each other in the X-axis direction are provided at positions shifted from each other in the Y-axis direction.

The plurality of second bottomed holes 51 are aligned in a zigzag pattern, for example, in a plan view. For example, the plurality of second bottomed holes 52 are provided at predetermined intervals along the X-axis direction, and are provided at predetermined intervals along the Y-axis direction. However, the second bottomed holes 51 adjacent to each other in the X-axis direction are provided at positions shifted from each other in the Y-axis direction. In addition, each second bottomed hole 51 is provided at a position shifted from the first bottomed hole 41 in the Y-axis direction, for example.

The first bottomed hole 41 and the second bottomed hole 51 partially overlap each other in a plan view. For example, an end portion of the first bottomed hole 41 and an end portion of the second bottomed hole 51 overlap each other in a plan view. As shown in FIGS. 3 and 4, in a portion where the first bottomed hole 41 and the second bottomed hole 51 overlap in a plan view, the first bottomed hole 41 and the second bottomed hole 51 partially communicate with each other to form a first pore 61. In addition, as shown in FIG. 5, in a portion where the first bottomed hole 41 and the second bottomed hole 51 overlap in a plan view, in the XZ cross section, the semi-circular first bottomed hole and the semi-circular second bottomed hole 51 communicate with each other to form the first fine pore 61.

An inner surface of each of the first groove portion 42 and the second groove portion 52 is formed in a shape similar to the inner surface of each of the first bottomed hole 41 and the second bottomed hole 51, for example. The inner surface of each of the first groove portion 42 and the second groove portion 52 of the present embodiment is formed in a concave shape with a semi-circular or semi-elliptical cross section. Note that the inner surface of each of the first groove portion 42 and the second groove portion 52 may be formed to have a tapered shape that widens from the bottom surface side toward the opening side. Further, the bottom surface of the first groove portion 42 may be formed to be a plane parallel to the first inner surface 31A of the first metal layer 31, and the inner surface of the first groove portion 42 may be formed to extend perpendicularly to the bottom surface. The bottom surface of the second groove portion 52 may be formed to be a plane parallel to the second inner surface 32A of the second metal layer 32, and the inner surface of the second groove portion 52 may be formed to extend perpendicularly to the bottom surface.

As shown in FIG. 4, each of first groove portions 42 is formed to communicate two first bottomed holes 41 adjacent to each other in the X-axis direction, for example. One end portion of each of the first groove portions 42 is connected to one first bottomed hole 41 of the two adjacent first bottomed holes 41, and the other end portion of each of the first groove portions 42 is connected to the other first bottomed hole 41 of the two adjacent first bottomed holes 41. Each of the second bottomed hole 52 is formed to communicate two second bottomed holes 51 adjacent to each other in the X-axis direction, for example. One end portion of each of the second groove portions 52 is connected to one second bottomed hole 51 of the two adjacent second bottomed holes 51, and the other end portion of each of the second groove portions 52 is connected to the other second bottomed hole 51 of the two adjacent second bottomed holes 51.

The planar shape of each of the first groove portion 42 and the second groove portion 52 may be formed to have any shape and any size. The planar shape of the first groove portion 42 may be formed to have any shape and any size, for example, as long as it has a structure capable of communicating a plurality of first bottomed holes 41. The planar shape of the second groove portion 52 may be formed to have any shape and any size, for example, as long as it has a structure capable of communicating a plurality of second bottomed holes 51. The planar shape of the first groove portion 42 and the planar shape of the second groove portion 52 may be the same or may be different from each other. The planar shape of each of the first groove portion 42 and the second groove portion 52 of the present embodiment is formed in a rectangular shape. The planar shape of each of the first groove portion 42 and the second groove portion 52 is formed in a rectangular shape extending along a direction intersecting both the X-axis direction and the Y-axis direction in the XY plane. A width of the first groove portion 42 is smaller than a width (diameter, here) of the first bottomed hole 41, for example. A width of the second groove portion 52 is smaller than a width (diameter, here) of the second bottomed hole 51, for example. The width of each of the first groove portion 42 and the second groove portion 52 may be set, for example, within a range of about 50 μm to 200 μm.

Some of the plurality of first groove portions 42 extend along a first direction D1 intersecting both the X-axis direction and the Y-axis direction, for example. Some of the plurality of first groove portions 42 extend along a second direction D2 intersecting the first direction D1 while intersecting both the X-axis direction and the Y-axis direction, for example. The plurality of first groove portions 42 extending along the first direction D1 are formed to extend parallel to each other. The plurality of first groove portions 42 extending along the second direction D2 are formed to extend parallel to each other.

Some of the plurality of second groove portions 52 extend along the first direction D1, for example. Some of the plurality of second groove portions 52 extend along the second direction D2, for example. The plurality of second groove portions 52 extending along the first direction D1 are formed to extend parallel to each other. The plurality of second groove portions 52 extending along the second direction D2 are formed to extend parallel to each other.

The first groove portion 42 and the second groove portion 52 are formed to intersect each other in a plan view. For example, each of the first groove portions 42 extending along the first direction D1 is formed to intersect the second groove portion 52 extending along the second direction D2 in a plan view. For example, each of the first groove portions 42 extending along the second direction D2 is formed to intersect the second groove portion 52 extending along the first direction D1 in a plan view. In a portion where the first groove portion 42 and the second groove portion 52 intersect each other in a plan view, the first groove portion 42 and the second groove portion 52 partially overlap each other in a plan view. For example, a central portion in the length direction of the first groove portion 42 and a central portion in the length direction of the second groove portion 52 overlap each other in a plan view.

Figure 6:
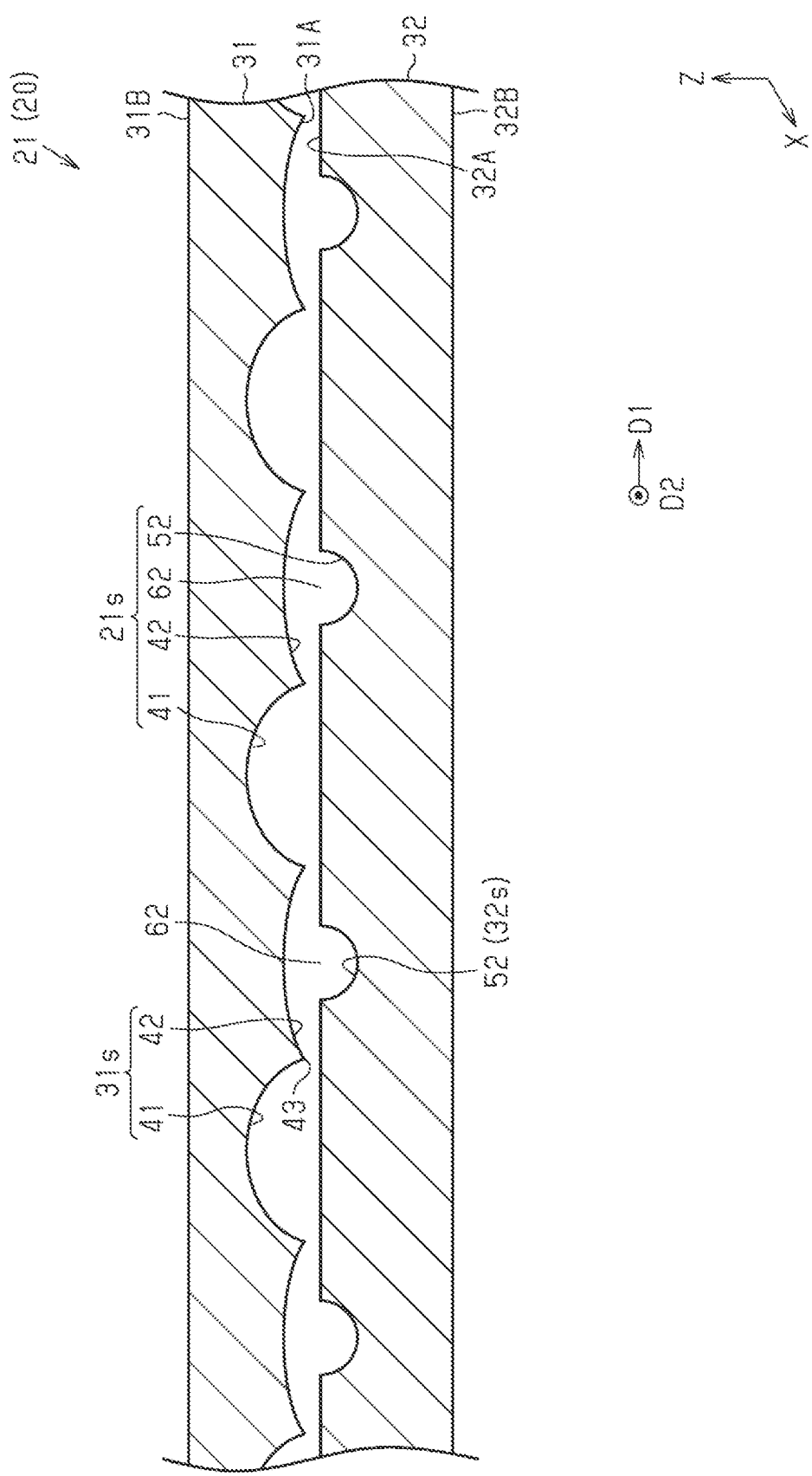
FIG. 6 is a schematic cross-sectional view (a cross-sectional view taken along a line 6-6 in FIG. 4) showing the evaporator of one embodiment.
Figure 7:
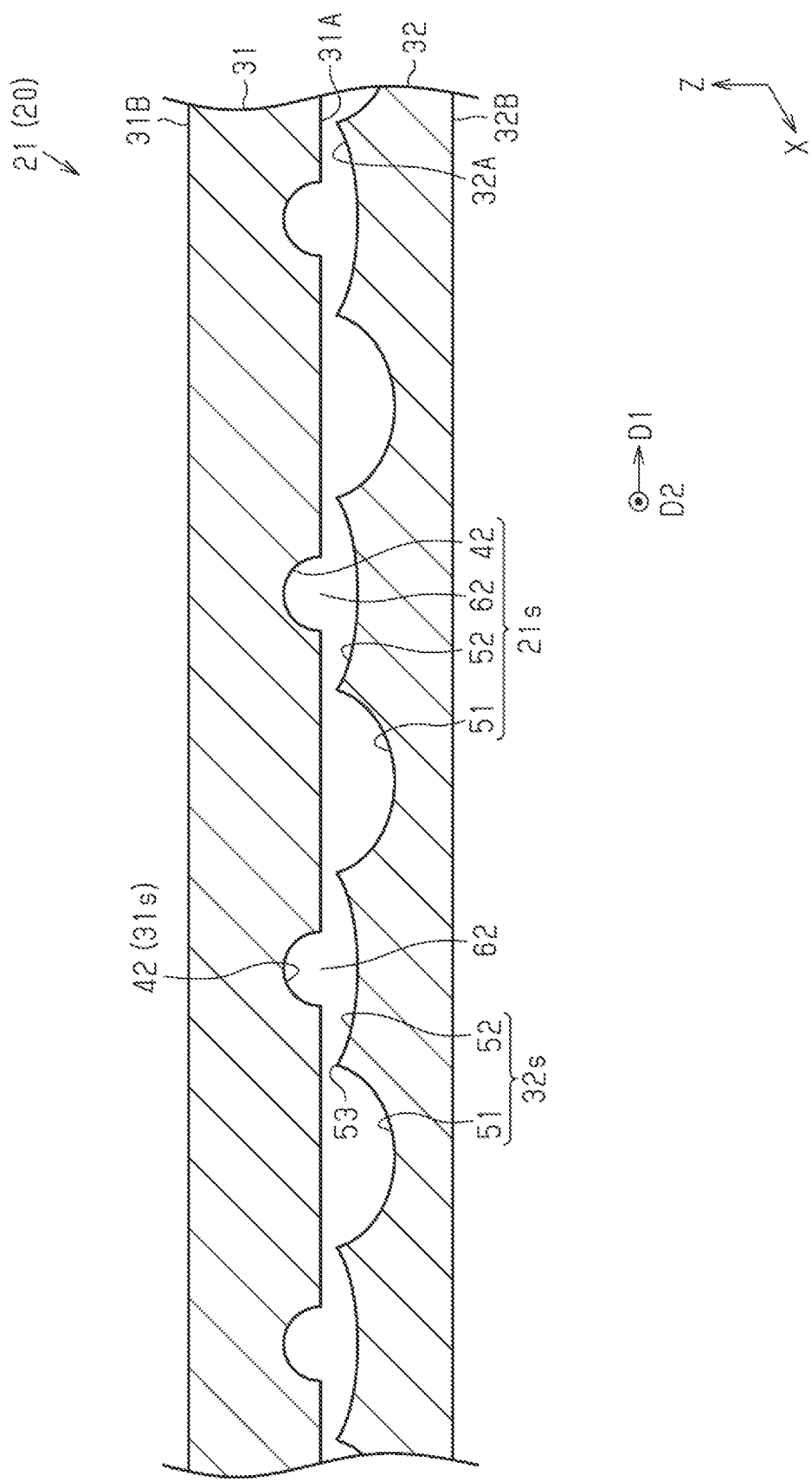
FIG. 7 is a schematic cross-sectional view (a cross-sectional view taken along a line 7-7 in FIG. 4) showing the evaporator of one embodiment.

As shown in FIGS. 5 to 7, in the portion where the first groove portion 42 and the second groove portion 52 overlap in a plan view, the first groove portion 42 and the second groove portion 52 partially communicate with each other to form a second fine pore 62. As shown in FIG. 5, in the portion where the first groove portion 42 and the second groove portion 52 overlap in a plan view, in the XZ cross section, the semi-circular first groove portion 42 and the semi-circular second groove portion 52 communicate with each other to form the second fine pore 62. The second fine pore 62 is formed smaller than the first fine pore 61, for example.

As shown in FIGS. 4 and 5, the first inner surface 31A between the first bottomed holes 41 on two rows adjacent to each other in the X-axis direction is formed with only the first groove portion 42. In other words, the first inner surface 31A between the first bottomed holes 41 on two rows adjacent to each other in the X-axis direction is formed with no concave portion other than the first groove portion 42. That is, the first inner surface 31A between the first bottomed holes 41 on two rows adjacent to each other in the X-axis direction is formed in a plane on a portion other than the first groove portion 42. Further, the second inner surface 32A between the second bottomed holes 51 on two rows adjacent to each other in the X-axis direction is formed with only the second groove portion 52. In other words, the second inner surface 32A between the second bottomed holes 51 on two rows adjacent to each other in the X-axis direction is formed in a plane on a portion other than the second groove portion 52. As shown in FIG. 5, in a portion, in which the first groove portion 42 and the second groove portion 52 are not formed, between the first bottomed holes 41 on two rows adjacent to each other in the X-axis direction, the first inner surface 31A and the second inner surface 32A are directly bonded to each other.

As shown in FIG. 6, in a first cross section obtained by cutting the porous body 21s in the XZ plane along the first direction D1 passing through the center in the width direction of the first groove portion 42, the first bottomed hole 41 and the first groove portion 42 are continuously formed along the first direction D1 in the first inner surface 31A of the first metal layer 31. Further, in the first cross section, the second inner surface 32A of the second metal layer 32 is partially formed with only the second groove portion 52. For example, the second inner surface 32A in the first cross section is formed with the second groove portion 52 at a position overlapping the central portion in the length direction (here, first direction D1) of the first groove portion 42 in a plan view, and is formed in a plane on a portion other than the second groove portion 52. In this way, the second groove portion 52 extending along the second direction D2 partially communicates with only a part in the length direction of the first groove portion 42 extending along the first direction D1, so that the second fine pore 62 is formed. Further, a boundary portion 43 between the first bottomed hole 41 and the first groove portion 42 is not in contact with the second inner surface 32A of the second metal layer 32. A space is provided between the boundary portion 43 and the second inner surface 32A of the second metal layer 32. Note that although not shown, in a cross section obtained by cutting the porous body 21s in the XZ plane along the second direction D2 passing through the center in the width direction of the first groove portion 42, the first metal layer 31 and the second metal layer 32 have a cross-sectional structure similar to that shown in FIG. 6.

As shown in FIG. 7, in a second cross section obtained by cutting the porous body 21s in the XZ plane along the first direction D1 passing through the center in the width direction of the second groove portion 52, the second bottomed hole 51 and the second groove portion 52 are continuously formed along the first direction D1 in the second inner surface 32A of the second metal layer 32. Further, in the second cross section, the first inner surface 31A of the first metal layer 31 is partially formed with only the first groove portion 42. For example, the first inner surface 31A in the second cross section is formed with the first groove portion 42 at a position overlapping the central portion in the length direction of the second groove portion 52 in a plan view, and is formed in a plane on a portion other than the first groove portion 42. In this way, the first groove portion 42 extending along the second direction D2 partially communicates with only a part in the length direction of the second groove portion 52 extending along the first direction D1, so that the second fine pore 62 is formed. Further, a boundary portion 53 between the second bottomed hole 51 and the second groove portion 52 is not in contact with the first inner surface 31A of the first metal layer 31. A space is provided between the boundary portion 53 and the first inner surface 31A of the first metal layer 31. Note that although not shown, in a cross section obtained by cutting the porous body 21s in the XZ plane along the second direction D2 passing through the center in the width direction of the second groove portion 52, the first metal layer 31 and the second metal layer 32 have a cross-sectional structure similar to that shown in FIG. 7.

As shown in FIG. 4, the first groove portion 42 is formed not to overlap the second bottomed hole 51 in a plan view, for example. That is, the first groove portion 42 is formed not to directly communicate with the second bottomed hole 51. The second groove portion 52 is formed not to overlap the first bottomed hole 41 in a plan view, for example. That is, the second groove portion 52 is formed not to directly communicate with the first bottomed hole 41.

As shown in FIGS. 3 to 7, the first bottomed hole 41, the first groove portion 42, the second bottomed hole 51, the second groove portion 52, the first fine pore 61, and the second fine pore 62 communicate with one another. A space formed as the first bottomed hole 41, the first groove portion 42, the second bottomed hole 51, the second groove portion 52, the first fine pore 61, and the second fine pore 62 communicate with one another expands three-dimensionally. The first bottomed hole 41, the first groove portion 42, the second bottomed hole 51, the second groove portion 52, the first fine pore 61 and the second fine pore 62, i.e., the flow channel of the porous body 21s functions as a flow channel through which the liquid working fluid C (refer to FIG. 1) flows.

(Specific Configuration of Space S2)

As shown in FIG. 3, the space S2 is formed as the first concave portion 71 of the first metal layer 31 and the second concave portion 72 of the second metal layer 32 communicate with each other. For example, the first concave portion 71 and the second concave portion 72 are formed to completely overlap each other in a plan view. That is, the entirety of the first concave portion 71 is formed to overlap the entirety of the second concave portion 72 in a plan view.

The first concave portion 71 is formed recessed from the first inner surface 31A of the first metal layer 31 to the central portion in the thickness direction of the first metal layer 31. A depth 71D of the first concave portion 71 is greater than the depth 41D of the first bottomed hole 41, for example. The depth 71D of the first concave portion 71 is, for example, a depth ranging from 1.1 to 1.3 times the depth 41D of the first bottomed hole 41. The depth 71D of the first concave hole 71 can be set, for example, within a range of about 25 μm to 130 μm.

The second concave portion 72 is formed recessed from the second inner surface 32A of the second metal layer 32 to the central portion in the thickness direction of the second metal layer 32. A depth 72D of the second concave portion 72 is greater than the depth 51D of the second bottomed hole 51, for example. The depth 72D of the second concave portion 72 is, for example, a depth ranging from 1.1 to 1.3 times the depth 51D of the second bottomed hole 51. The depth 72D of the second concave portion 72 can be set, for example, within a range of about 25 μm to 130 μm.

The inner surface of each of the first concave portion 71 and the second concave portion 72 may be formed to have any shape. The inner surface of each of the first concave portion 71 and the second concave portion 72 of the present embodiment is formed in a concave shape with a rectangular cross section. Note that the inner surface of each of the first concave portion 71 and the second concave portion 72 may be formed to have a tapered shape that widens from the bottom surface side toward the opening side. In addition, the inner surface of each of the first concave portion 71 and the second concave portion 72 may be formed in a concave shape with a semi-circular or semi-elliptical cross section.

The space S2 communicates with the flow channel of the porous body 21s, for example. For example, the first concave portion 71 communicates with the first bottomed hole 41 or the first groove portion 42. For example, the second concave portion 72 communicates with the second bottomed hole 51 or the second groove portion 52. Note that the first groove portion 42 that communicates with the first concave portion 71 is formed to communicate the first bottomed hole 41 and the first concave portion 71 each other. The second groove portion 52 that communicates with the second concave portion 72 is formed to communicate the second bottomed hole 51 and the second concave portion 72 each other.

(Configuration of Vapor Pipe 22)

Figure 8:
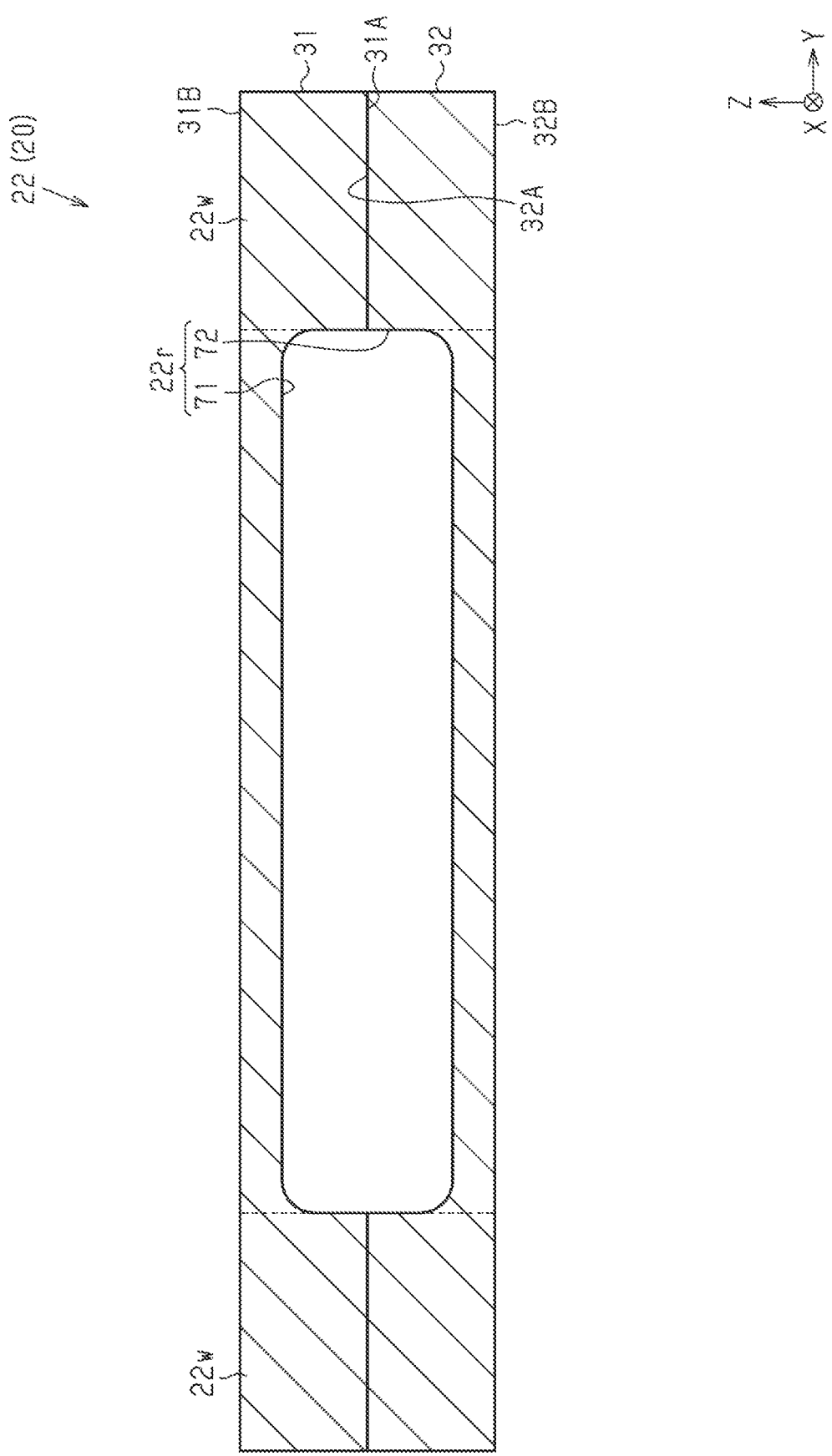
FIG. 8 is a schematic cross-sectional view (a cross-sectional view taken along a line 8-8 in FIG. 1) showing a vapor pipe of one embodiment.

As shown in FIG. 8, the vapor pipe 22 is formed by stacking two layers of the first metal layer 31 and the second metal layer 32, like the evaporator 21. In the vapor pipe 22, the first concave portion 71 provided in the first inner surface 31A of the first metal layer 31 and the second concave portion 72 provided in the second inner surface 32A of the second metal layer 32 communicate with each other to form the flow channel 22r. The vapor pipe 22 has the pair of pipe walls 22w provided on opposite sides in the width direction (here, Y-axis direction) orthogonal to the length direction (here, X-axis direction) of the vapor pipe 22. Each of the pipe walls 22w is not formed with a hole or a groove. Note that the flow channel 22r is provided between the pair of pipe walls 22w.

(Configuration of Condenser 23)

Figure 9:
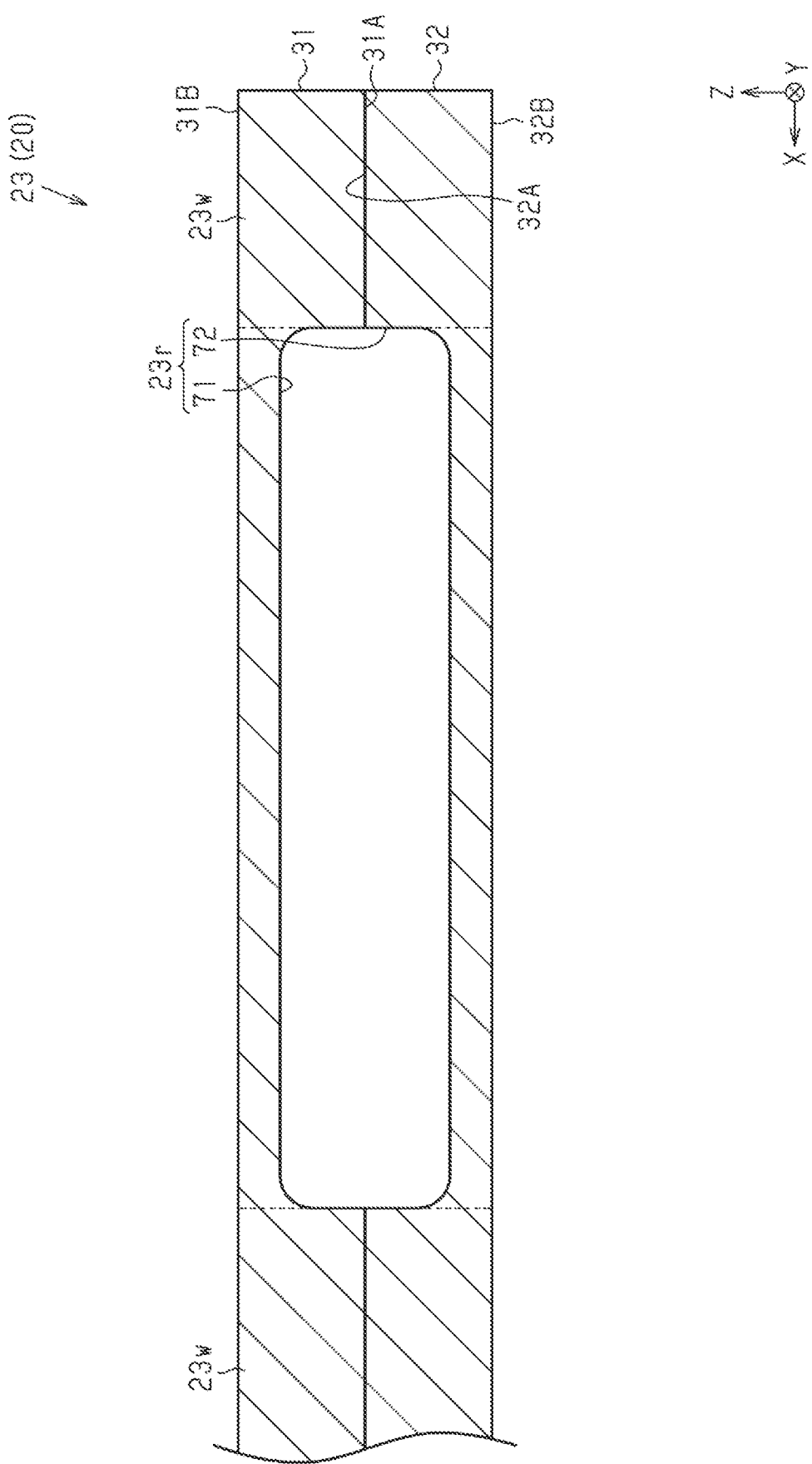
FIG. 9 is a schematic cross-sectional view (a cross-sectional view taken along a line 9-9 in FIG. 1) showing a condenser of one embodiment.

As shown in FIG. 9, the condenser 23 is formed by stacking two layers of the first metal layer 31 and the second metal layer 32, like the evaporator 21. In the condenser 23, the first concave portion 71 provided in the first inner surface 31A of the first metal layer 31 and the second concave portion 72 provided in the second inner surface 32A of the second metal layer 32 communicate with each other to form the flow channel 23r. The condenser 23 has the pair of pipe walls 23w provided on opposite sides in the width direction (here, X-axis direction) orthogonal to the length direction (here, Y-axis direction) of the condenser 23. Each of the pipe walls 23w is not formed with a hole or a groove. Note that the flow channel 23r is provided between the pair of pipe walls 23w.

(Configuration of Liquid Pipe 24)

Figure 10:
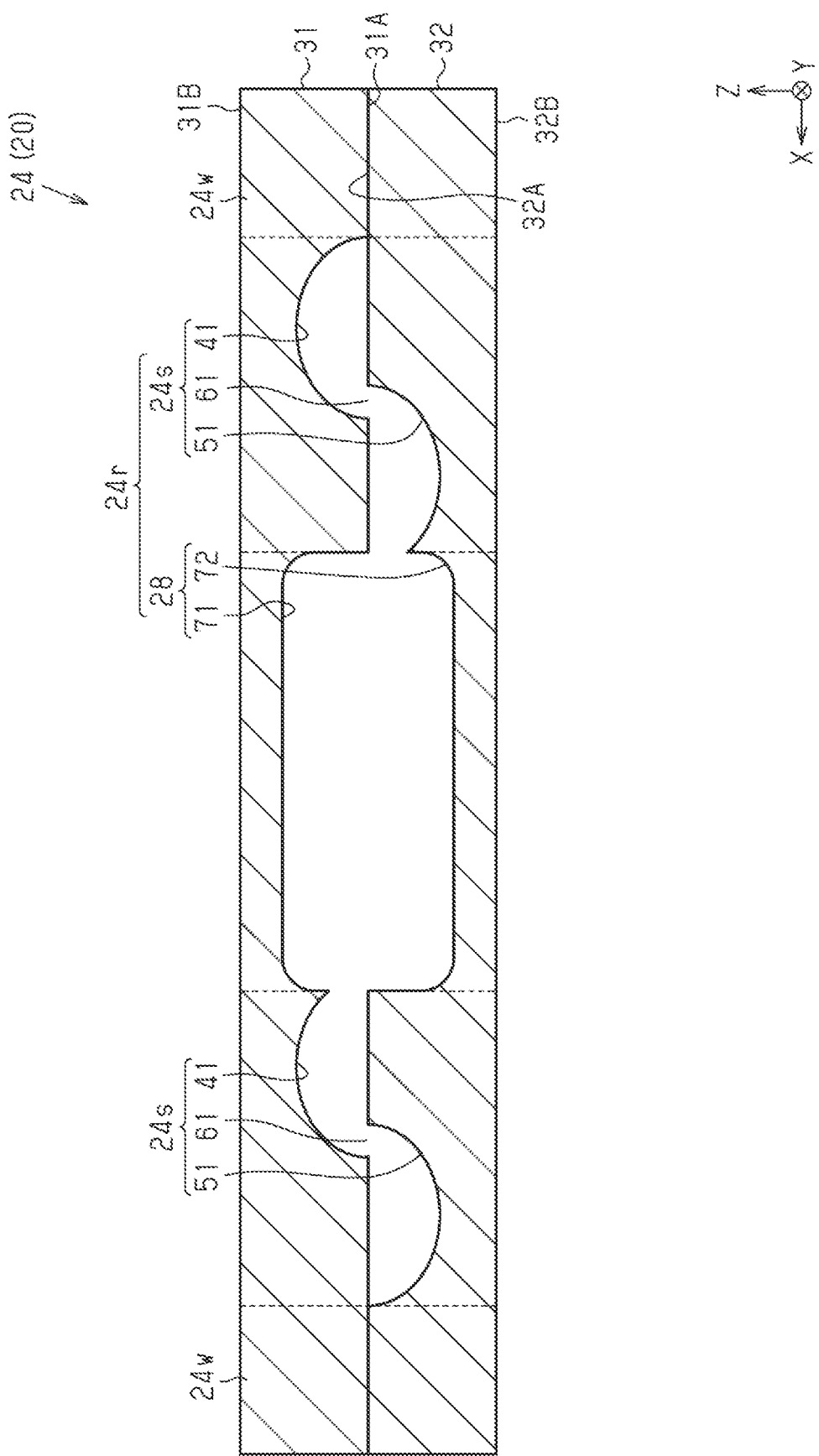
FIG. 10 is a schematic cross-sectional view (a cross-sectional view taken along a line 10-10 in FIG. 1) showing a liquid pipe of one embodiment.

As shown in FIG. 10, the liquid pipe 24 is formed by stacking two layers of the first metal layer 31 and the second metal layer 32, like the evaporator 21. The liquid pipe 24 includes the pair of pipe walls 24w provided at opposite ends in the width direction (here, X-axis direction) of the liquid pipe 24, the flow channel 28 provided between the pair of pipe walls 24w, the pair of porous bodies 24s provided on opposite sides of the flow channel 28 in the width direction of the liquid pipe 24. In the liquid pipe 24, the first concave portion 71 provided in the first inner surface 31A of the first metal layer 31 and the second concave portion 72 provided in the second inner surface 32A of the second metal layer 32 communicate with each other to form the flow channel 28. By providing the flow channel 28 in the liquid pipe 24, a storage amount of the working fluid C in the liquid pipe 24 can be increased.

Each of the porous bodies 24s is integrally formed continuous with the wall 24w, for example. Each of the porous bodies 24s has a structure similar to that of the porous body 21s shown in FIGS. 3 to 7, for example. Each of the porous bodies 24s has the first bottomed hole 41 provided in the first inner surface 31A of the first metal layer 31, the second bottomed hole 51 provided in the second inner surface 32A of the second metal layer 32, and the first fine pore 61 formed as the first bottomed hole 41 and the second bottomed hole 51 partially communicate with each other. Although not shown, each of the porous bodies 24s has the first groove portion 42 (refer to FIG. 5), the second groove portion 52 (refer to FIG. 5), and the second fine pore (refer to FIG. 5) formed as the first groove portion 42 and the second groove portion 52 partially communicate with each other. The flow channel (i.e., the first bottomed hole 41, the first groove portion 42, the second bottomed hole 51, the second groove portion 52, the first fine pore 61 and the second fine pore 62) of each of the porous bodies 24s functions as the flow channel 24r through which the liquid working fluid C (refer to FIG. 1) flows. In the liquid pipe 14 of the present embodiment, the flow channel 24r is constituted by the flow channel and the flow channel 24r of each of the porous bodies 24s.

Although not shown, the liquid pipe 24 is provided with an injection port for injecting the working fluid C (refer to FIG. 1). However, the injection port is closed by a sealing member, so that an inside of the loop-type heat pipe 20 is kept airtight.

(Method of Manufacturing Loop-Type Heat Pipe 20)

Next, a method of manufacturing the loop-type heat pipe 20 will be described with reference to FIGS. 11A to 16B. Note that, each of FIGS. 11A, 12A, 13A, 14A, 15A and 16A shows a cross-sectional structure at a position corresponding to a line 3-3 in FIG. 2, and each of FIGS. 11B, 12B, 13B, 14B, 15B and 16B shows a cross-sectional structure at a position corresponding to a line 5-5 in FIG. 2. In addition, FIGS. 11A, 12A, 13A, 14A, 15A and 16A, and FIGS. 11B, 12B, 13B, 14B, 15B and 16B show processes that are performed simultaneously, although cutting positions differ from each other.

First, in a process shown in FIGS. 11A and 11B, a flat plate-shaped metal sheet 80 is prepared. The metal sheet 80 is a member that finally becomes the first metal layer 31 (refer to FIG. 3). The metal sheet 80 has a first inner surface 31A and a first outer surface 31B. The metal sheet 80 is made of, for example, copper, stainless steel, aluminum, a magnesium alloy, or the like. A thickness of the metal sheet 80 may be set, for example, within a range of about 50 μm to 200 μm.

Subsequently, a first resist layer 81 is formed on the first inner surface 31A of the metal sheet 80, and a second resist layer 82 is formed on the first outer surface 31B of the metal sheet 80. The first resist layer 81 is formed to cover the entire surface of the first inner surface 31A of the metal sheet 80. The second resist layer 82 is formed to cover the entire surface of the first outer surface 31B of the metal sheet 80. As the first resist layer 81 and the second resist layer 82, for example, a photosensitive dry film resist or the like may be used.

Figure 12A:
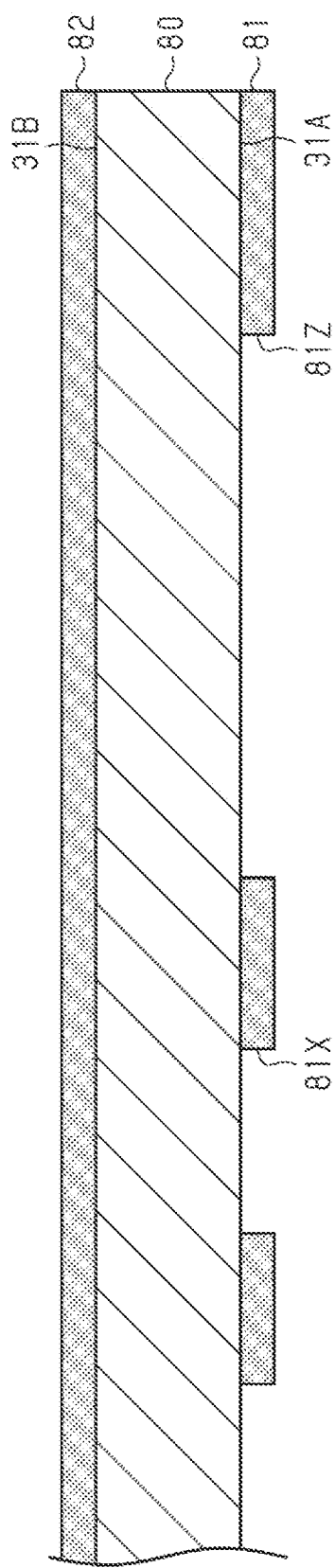
FIGS. 12A and 12B are schematic cross-sectional views showing the method of manufacturing a loop-type heat pipe of one embodiment.
Figure 12B:
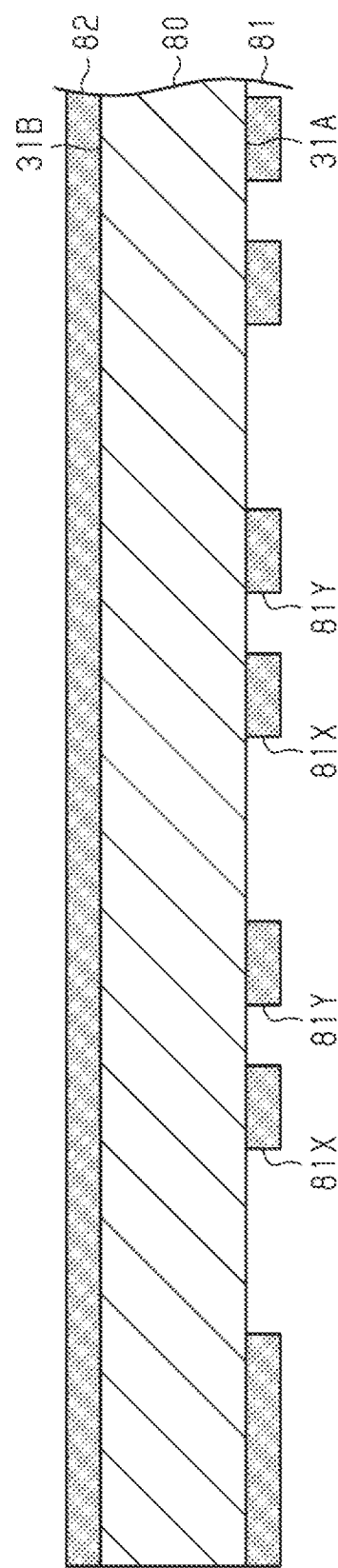

Next, in a process shown in FIGS. 12A and 12B, the first resist layer 81 is patterned to form openings 81X, 81Y and 81Z, which selectively expose the first inner surface 31A of the metal sheet 80, in the first resist layer 81. For example, the first resist layer 81 is exposed and developed to form the openings 81X, 81Y and 81Z in the first resist layer 81. The opening 81X shown in FIGS. 12A and 12B is formed to correspond to the first bottomed hole 41 shown in FIG. 3. The opening 81Y shown in FIG. 12B is formed to correspond to the first groove portion 42 shown in FIG. 5. The opening 81Z shown in FIG. 12A is formed to correspond to the first concave portion 71 shown in FIG. 3. Here, a width of the opening 81Y is formed smaller than a width of the opening 81X. In addition, the width of the opening 81X is formed smaller than a width of the opening 81Z. Note that the openings 81X, 81Y and 81Z are formed simultaneously in the same process, for example.

Subsequently, in a process shown in FIGS. 13A and 13B, the metal sheet 80 exposed in the openings 81X, 81Y and 81Z is etched from the first inner surface 31A side of the metal sheet 80. Thereby, a first bottomed hole 41, a first groove portion 42, and a first concave portion 71 are simultaneously formed in the first inner surface 31A of the metal sheet 80. Specifically, as shown in FIGS. 13A and 13B, the metal sheet 80 exposed from the opening 81X is etched from the first inner surface 31A side, so that the first bottomed hole 41 is formed. As shown in FIG. 13B, the metal sheet 80 exposed from the opening 81Y is etched from the first inner surface 31A side, so that the first groove portion 42 is formed. As shown in FIG. 13A, the metal sheet 80 exposed from the opening 81Z is etched from the first inner surface 31A side, so that the first concave portion 71 is formed. The first bottomed hole 41, first groove portion 42 and first concave portion 71 may be formed by, for example, wet etching the metal sheet 80 by using the first resist layer 81 and the second resist layer 82 as etching masks. When copper is used as the material of the metal sheet 80, a ferric chloride aqueous solution or a copper chloride aqueous solution may be used as an etching solution.

Next, the first resist layer 81 and the second resist layer 82 are peeled off by a stripping solution. Thereby, as shown in FIGS. 14A and 14B, a first metal layer 31 having the first bottomed hole 41, the first groove portion 42 and the first concave portion 71 in the first inner surface 31A can be formed.

Next, in a process shown in FIGS. 15A and 15B, a second metal layer 32 having a second bottomed hole 51, a second groove portion 52 and a second concave portion 72 in the second inner surface 32A is formed by a method similar to the processes shown in FIGS. 11 to 14. Subsequently, the first metal layer 31 is arranged above the second metal layer 32 so that the first inner surface 31A and the second inner surface 32A face each other.

Subsequently, in a process shown in FIGS. 16A and 16B, the stacked first metal layer 31 and second metal layer 32 are pressed while heating the same at a predetermined temperature (e.g., about 900° C.). Thereby, the first metal layer 31 and the second metal layer 32 are bonded by solid-phase bonding. In this case, the first inner surface 31A (here, lower surface) of the first wall portion 31w and the second inner surface 32A (here, upper surface) of the second wall portion 32w are directly bonded. In addition, the first inner surface 31A, in which the first bottomed hole 41 and the first groove portion 42 are not formed, of the first porous body 31s and the second inner surface 32A, in which the second bottomed hole 51 and the second groove portion 52 are not formed, of the second porous body 32s are directly bonded.

By the processes described above, a structure in which the first metal layer 31 and the second metal layer 32 are stacked is formed. Then, the loop-type heat pipe 20 having the evaporator 21, the vapor pipe 22, the condenser 23, and the liquid pipe 24 shown in FIG. 1 is formed. Thereafter, for example, after exhausting the inside of the liquid pipe 24 by using a vacuum pump or the like, the working fluid C is injected into the liquid pipe 24 from an injection port (not shown), and then the injection port is sealed.

Subsequently, operational effects of the present embodiment are described.

(1) The loop-type heat pipe 20 is formed by only the two metal layers of the first metal layer 31 and the second metal layer 32. This makes it possible to reduce a thickness of the loop-type heat pipe 20, as compared with a case in which three or more metal layers are stacked. In addition, since an amount of metal layers used can be reduced, as compared with the case in which three or more metal layers are stacked, the manufacturing cost of the loop-type heat pipe 20 can be reduced.

(2) When three or more metal layers are bonded, unevenness may arise in a bonded state among the respective metal layers. In contrast, since the loop-type heat pipe 20 of the present embodiment is constituted by only two metal layers, i.e., the first metal layer 31 and the second metal layer 32, the stability of the bonding between the first metal layer 31 and the second metal layer 32 can be improved.

(3) The first inner surface 31A of the first metal layer 31 is formed with the first bottomed hole 41 and the first groove portion 42, and the second inner surface 32A of the second metal layer 32 is formed with the second bottomed hole 51 and the second groove portion 52. Further, the first fine pore 61 is formed by partially communicating the first bottomed hole 41 and the second bottomed hole 51 each other. Thereby, the three-dimensional flow channel functioning as the porous body 21s can be formed by only the first metal layer 31 and the second metal layer 32 as the outer metal layers, without providing an inner metal layer. The condensed working fluid C can be favorably moved three-dimensionally by the capillary force generated in the porous body 21s.

(4) The porous body 21s has the first bottomed hole 41, the first groove portion 42, the second bottomed hole 51, the second groove portion 52, and the first fine pore 61. Further, the porous body 21s has the second fine pores 62 formed by partially communicating the first groove portions 42 and the second groove portions 52 each other. In this configuration, the first bottomed hole 41, the first groove portion 42, the second bottomed hole 51, the second groove portion 52, the first fine pore 61, and the second fine pore 62 communicate with one another. Then, the space which is formed by the first bottomed hole 41, the first groove portion 42, the second bottomed hole 51, the second groove portion 52, the first fine pore 61, and the second fine pore 62 communicating with one another, i.e., the flow channel of the porous body 21s can be favorably formed to expand three-dimensionally. In addition, by providing the second fine pores 62, it is possible to increase the number of three-dimensionally communicating portions in the flow channel of the porous body 21s, so that the liquid working fluid C can be favorably moved three-dimensionally in the flow channel of the porous body 21s.

(5) Further, since the second fine pore 62 is formed by partially communicating the first groove portion 42 and the second groove portion 52 each other, the second fine pore 62 is formed smaller, as compared with a case in which the entirety of the first groove portion 42 and the entirety of the second groove portion 52 communicate with each other. As a result, since the capillary force generated in the second fine pores 62 can be increased, the liquid working fluid C can be favorably moved three-dimensionally in the flow channel of the porous body 21s.

(6) The first bottomed hole 41 is formed deeper than the first groove portion 42, and the second bottomed hole 51 is formed deeper than the second groove portion 52.

In other words, the first groove portion 42 is formed shallower than the first bottomed hole 41, and the second grooved portion 52 is formed shallower than the second bottomed hole 51. Further, the width of the first groove portion 42 is smaller than the width of the first bottomed hole 41, and the width of the second groove portion 52 is smaller than the width of the second bottomed hole 51. As a result, since the capillary force generated in the first groove portion 42 and the second groove portion 52 can be increased, the liquid working fluid C can be favorably moved three-dimensionally in the flow channel of the porous body 21s.

(7) If the respective depths 42D and 52D of the first groove portion 42 and the second groove portion 52 are shallow, the possibility that the first groove portion 42 and the second groove portion 52 will be crushed upon bonding of the first metal layer 31 and the second metal layer 32 increases. If the first groove portion 42 and the second groove portion 52 are crushed, the adjacent first bottomed holes 41 cannot communicate with each other and the adjacent second bottomed holes 51 cannot communicate with each other. In contrast, in the present embodiment, the depth 42D of the first groove portion 42 is set to a depth within the range of 0.5 times or greater and less than 0.8 times the depth 41D of the first bottomed hole 41, and the depth 52D of the second groove portion 52 is set to a depth within the range of 0.5 times or greater and less than 0.8 times the depth 51D of the second bottomed hole 51. That is, each of the first groove portion 42 and the second groove portion 52 is formed shallower than the first bottomed hole 41 and the second bottomed hole 51, but is also formed deep to some extent. According to this configuration, while increasing the capillary force generated in the first groove portion 42 and the second groove portion 52, the first groove portion 42 and the second groove portion 52 can be favorably suppressed from being crushed when bonding the first metal layer 31 and the second metal layer 32. Thereby, in a state in which the first metal layer 31 and the second metal layer 32 are bonded, the first groove portion 42 communicating the adjacent first bottomed holes 51 each other and the second groove portion 52 communicating the adjacent second bottomed holes 51 each other can be favorably maintained. As a result, the three-dimensional flow channel of the porous body 21s can be favorably maintained in the state where the first metal layer 31 and the second metal layer 32 are bonded.

(8) The first concave portion 71 is formed in the first inner surface 31A of the first metal layer 31, and the second concave portion 72 is formed in the second inner surface 32A of the second metal layer 32. Further, by communicating the first concave portion 71 and the second concave portion 72 each other, the space S2 in which the vaporized working fluid C (namely, vapor Cv) moves is formed. Thereby, the space S2 serving as the movement space for the gaseous working fluid C can be formed with only the first metal layer 31 and the second metal layer 32 as the outer metal layers, without providing an inner metal layer.

(9) The first resist layer 81 having the openings 81X and 81Y for selectively exposing the first inner surface 31A of the metal sheet 80 is formed, and the metal sheet 80 exposed from the openings 81X and 81Y is etched from the first inner surface 31A side. Thereby, the first bottomed hole 41 and the first groove portion 42 are simultaneously formed in the first inner surface 31A of the first metal layer 31. For this reason, as compared with a case in which the first bottomed hole 41 and the first groove portion 42 are formed in separate processes, the number of the manufacturing processes can be reduced. Further, both the first bottomed hole 41 and the first groove portion 42 can be formed using one first resist layer 81 as an etching mask.

(10) The first resist layer 81 having the openings 81X, 81Y and 81Z in the first inner surface 31A of the metal sheet 80 is formed, and the metal sheet 80 exposed from the openings 81X, 81Y and 81Z is etched from the first inner surface 31A side. Thereby, the first bottomed hole 41, the first groove portion 42, and the first concave portion 71 are simultaneously formed in the first inner surface 31A of the first metal layer 31. For this reason, as compared with a case where the first bottomed hole 41, the first groove portion 42, and the first concave portion 71 are formed in separate processes, the number of the manufacturing processes can be reduced.

Other Embodiments

The above embodiment can be changed and implemented as follows. The above embodiment and the following modified embodiments can be implemented in combination with each other within a technically consistent range.

In the above embodiment, the depth 71D of the first concave portion 71 is formed deeper than the depth 41D of the first bottomed hole 41. However, the present invention is not limited thereto. For example, the depth 71D of the first concave portion 71 may be formed to be the same as the depth 41D of the first bottomed hole 41.

In the above embodiment, the depth 72D of the second concave portion 72 is formed deeper than the depth 51D of the second bottomed hole 51. However, the present invention is not limited thereto. For example, the depth 72D of the second concave portion 72 may be formed to be the same as the depth 51D of the second bottomed hole 51.

In the above embodiment, the depth 42D of the first groove portion 42 is formed shallower than the depth 41D of the first bottomed hole 41. However, the present invention is not limited thereto. For example, the depth 42D of the first groove portion 42 may be formed to be the same as the depth 41D of the first bottomed hole 41.

In the above embodiment, the depth 52D of the second groove portion 52 is formed shallower than the depth 51D of the second bottomed hole 51. However, the present invention is not limited thereto. For example, the depth 52D of the second groove portion 52 may be formed to be the same as the depth 51D of the second bottomed hole 51.

In the above embodiment, the depth 41D of the first bottomed hole 41 and the depth 51D of the second bottomed hole 51 may be different from each other.

In the above embodiment, the depth 42D of the first groove portion 42 and the depth 52D of the second groove portion 52 may be different from each other.

In the above embodiment, the depth 71D of the first concave portion 71 and the depth 72D of the second concave portion 72 may be different from each other.

The alignment of the first bottomed hole 41 and the second bottomed hole 51 in the above embodiment may be changed as appropriate. For example, the alignment of the first bottomed hole 41 and the second bottomed hole 51 is not particularly limited as long as the first bottomed hole 41 and the second bottomed hole 51 are aligned to partially communicate with each other.

In the above embodiment, the first groove portion 42 is formed not to overlap the second bottomed hole 51 in a plan view. However, the present invention is not limited thereto. For example, the first groove portion 42 may be formed to overlap a part of the second bottomed hole 51 in a plan view. In this case, the first groove portion 42 and the second bottomed hole 51 partially communicate with each other.

In the above embodiment, the second groove portion 52 is formed not to overlap the first bottomed hole 41 in a plan view. However, the present invention is not limited thereto. For example, the second groove portion 52 may be formed to overlap a part of the first bottomed hole 41 in a plan view. In this case, the second groove portion 52 and the first bottomed hole 41 partially communicate with each other.

In the above embodiment, the first groove portion 42 and the second groove portion 52 are formed such that the first groove portion 42 and the second groove portion 52 intersect in a plan view. However, the present invention is not limited thereto. For example, the first groove portion 42 and the second groove portion 52 may be formed such that the first groove portion 42 and the second groove portion 52 do not overlap each other in a plan view. In this case, the formation of the second fine pores 62 is omitted.

The structure of the liquid pipe 24 in the above embodiment can be appropriately changed. For example, the arrangement of the flow channel 28 and the porous body 24s in the liquid pipe 24 may be appropriately changed. For example, the porous body 24s may be arranged at the center in the width direction of the liquid pipe 24, and the flow channels 28 may be arranged on opposite sides of the porous body 24s. For example, the flow channel 28 in the liquid pipe 24 may be omitted.

A porous body similar to the porous body 21s may be provided in the vapor pipe 22 in the above embodiment.

A porous body similar to the porous body 21s may be provided in the condenser 23 in the above embodiment.

This disclosure further encompasses various exemplary embodiments, for example, described below.

[1] A method of manufacturing a loop-type heat pipe comprising an evaporator configured to vaporize a working fluid, a condenser configured to condense the working fluid, a liquid pipe configured to connect the evaporator and the condenser, a vapor pipe configured to connect the evaporator and the condenser, and a loop-shaped flow channel provided in each of the evaporator, the condenser, the liquid pipe, and the vapor pipe, and through which the working fluid flows, the method comprising:
forming a first metal layer having a first inner surface in which a first bottomed hole and a first groove portion communicating with the first bottomed hole are provided;
forming a second metal layer having a second inner surface in which a second bottomed hole and a second groove portion communicating with the second bottomed hole are provided; and
forming the evaporator by stacking the first metal layer and the second metal layer with the first inner surface and the second inner surface facing each other,
wherein the forming of the first metal layer comprises:
preparing a metal sheet having the first inner surface and a first outer surface,
forming a first resist layer for covering the first inner surface of the metal sheet and forming a second resist layer for covering the first outer surface of the metal sheet,
patterning the first resist layer to form a first opening and a second opening for selectively exposing the first inner surface of the metal sheet, in the first resist layer, and
forming the first bottomed hole and the first groove portion in the first inner surface at the same time by etching, from the first inner surface side, the metal sheet exposed from the first opening and the second opening.

What is claimed is:

1. A loop-type heat pipe comprising:
an evaporator configured to vaporize a working fluid;
a condenser configured to condense the working fluid;
a liquid pipe configured to connect the evaporator and the condenser to each other;
a vapor pipe configured to connect the evaporator and the condenser to each other; and
a loop-shaped flow channel provided in each of the evaporator, the condenser, the liquid pipe, and the vapor pipe, and through which the working fluid flows,
wherein at least one of the evaporator, the condenser, the liquid pipe, and the vapor pipe comprises:
a first metal layer having a first inner surface and a first outer surface,
a second metal layer having a second inner surface bonded to the first inner surface and a second outer surface, and
a porous body provided between the first outer surface and the second outer surface,
wherein the porous body comprises:
a first bottomed hole provided in the first inner surface,
a second bottomed hole provided in the second inner surface,
a first fine pore, wherein the first bottomed hole and the second bottomed hole partially communicate with each other through the first fine pore,
a first groove portion provided in the first inner surface and configured to communicate with the first bottomed hole, and
a second groove portion provided in the second inner surface and configured to communicate with the second bottomed hole,
wherein the first outer surface and the second outer surface serve as an outer surface of the at least one of the evaporator, the condenser, the liquid pipe, and the vapor pipe.

2. The loop-type heat pipe according to claim 1, wherein the porous body has a second fine pore in which the first groove portion and the second groove portion partially communicate with each other through the second fine pore.

3. The loop-type heat pipe according to claim 2, wherein the first groove portion and the second groove portion intersect with each other in a plan view, and
wherein the second fine pore is provided at a portion where the first groove portion and the second groove portion intersect in the plan view.

4. The loop-type heat pipe according to claim 1, wherein the first bottomed hole is deeper than the first groove portion, and
wherein the second bottomed hole is deeper than the second groove portion.

5. The loop-type heat pipe according to claim 4, wherein a depth of the first groove portion is a depth within a range of 0.5 times or greater and less than 0.8 times a depth of the first bottomed hole, and
wherein a depth of the second groove portion is a depth within a range of 0.5 times or greater and less than 0.8 times a depth of the second bottomed hole.

6. The loop-type heat pipe according to claim 1, wherein a width of the first groove portion is smaller than a width of the first bottomed hole, and
   wherein a width of the second groove portion is smaller than a width of the second bottomed hole.

7. The loop-type heat pipe according to claim 1, wherein the evaporator comprises the first metal layer, the second metal layer and the porous body,
   wherein the evaporator has a space in which the vaporized working fluid moves,
   wherein the space is formed by a first concave portion provided in the first inner surface and a second concave portion provided in the second inner surface, and
   wherein the space is configured to communicate with a flow channel formed by the first bottomed hole, the second bottomed hole, the first fine pore, the first groove portion and the second groove portion of the porous body.

8. The loop-type heat pipe according to claim 7, wherein the first concave portion is deeper than the first bottomed hole, and
   wherein the second concave portion is deeper than the second bottomed hole.

\* \* \* \* \*